US012713687B2

(12) United States Patent
Lee et al.

(10) Patent No.: US 12,713,687 B2
(45) Date of Patent: Aug. 18, 2026

(54) GATE STRUCTURES IN SEMICONDUCTOR DEVICES

(71) Applicant: Taiwan Semiconductor Manufacturing Company, Ltd., Hsinchu City (TW)

(72) Inventors: Shen-Yang Lee, Miaoli County (TW); Hsiang-Pi Chang, New Taipei City (TW); Huiching Chang, Tainan City (TW); Shao An Wang, Hsinchu City (TW); Kenichi Sano, Hsinchu City (TW); Huang-Lin Chao, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 449 days.

(21) Appl. No.: 18/128,119

(22) Filed: Mar. 29, 2023

(65) Prior Publication Data

US 2024/0332091 A1 Oct. 3, 2024

(51) Int. Cl.
*H10D 84/03* (2025.01)
*H10D 30/01* (2025.01)
(Continued)

(52) U.S. Cl.
CPC ......... *H10D 84/038* (2025.01); *H10D 30/014* (2025.01); *H10D 30/43* (2025.01); *H10D 30/6735* (2025.01); *H10D 30/6739* (2025.01); *H10D 62/121* (2025.01); *H10D 64/01318* (2026.01); *H10D 84/0167* (2025.01); *H10D 84/017* (2025.01); *H10D 84/0177* (2025.01); *H10D 84/85* (2025.01)

(58) Field of Classification Search
CPC ......... H10D 30/501–509; H10D 30/43; H10D 30/47; H10D 30/6211; H10D 30/62; H10D 30/6217; H10D 30/6218; H10D 30/6219; H10D 30/6733; H10D 30/6734; H10D 30/6735; H10D 30/6748
See application file for complete search history.

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

TW 201933446 A 8/2019

*Primary Examiner* — Christine S. Kim
*Assistant Examiner* — Cole Leon Lindsey
(74) *Attorney, Agent, or Firm* — Sterne, Kessler, Goldstein & Fox P.L.L.C.

(57) ABSTRACT

A semiconductor device and a method of fabricating the semiconductor device are disclosed. The method includes forming nanostructured channel regions, forming gate openings surrounding the nanostructured channel regions, forming oxide layers on exposed surfaces of the nanostructured channel regions in the gate openings, depositing a diffusion barrier layer on the oxide layers, depositing a first dielectric layer on the diffusion barrier layer, performing a doping process on the diffusion barrier layer and the first dielectric layer to form a doped diffusion barrier layer and a doped dielectric layer, and depositing a conductive layer on the doped dielectric layer.

20 Claims, 28 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/85*** | (2025.01) |

(56) References Cited

U.S. PATENT DOCUMENTS

| | | | | |
|---|---|---|---|---|
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 2004/0043557 | A1 | 3/2004 | Haukka et al. | |
| 2016/0148934 | A1 | 5/2016 | Ji et al. | |
| 2019/0148237 | A1 | 5/2019 | Wang | |
| 2019/0371676 | A1 | 12/2019 | Bao et al. | |
| 2021/0125986 | A1* | 4/2021 | Vellianitis | H10D 84/853 |
| 2021/0391220 | A1* | 12/2021 | Savant | H10D 64/514 |
| 2022/0199620 | A1* | 6/2022 | Thomas | H10D 84/0181 |
| 2022/0293515 | A1* | 9/2022 | Hsieh | H10W 20/081 |
| 2022/0367291 | A1 | 11/2022 | Hsu et al. | |

* cited by examiner

112A1
646
525N1
523N1
122
112A2
646
525N2
523N2
122
112A3
646
525N3
523N3
122
112B1
646
525P1
523P1
122
112B2
646
525P2
523P2
122
112B3
646
525P3
523P3
122
X
Y
Z

GATE STRUCTURES IN SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), fin field effect transistors (finFETs), and gate-all-around (GAA) FETs. Such scaling down has increased the complexity of semiconductor manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
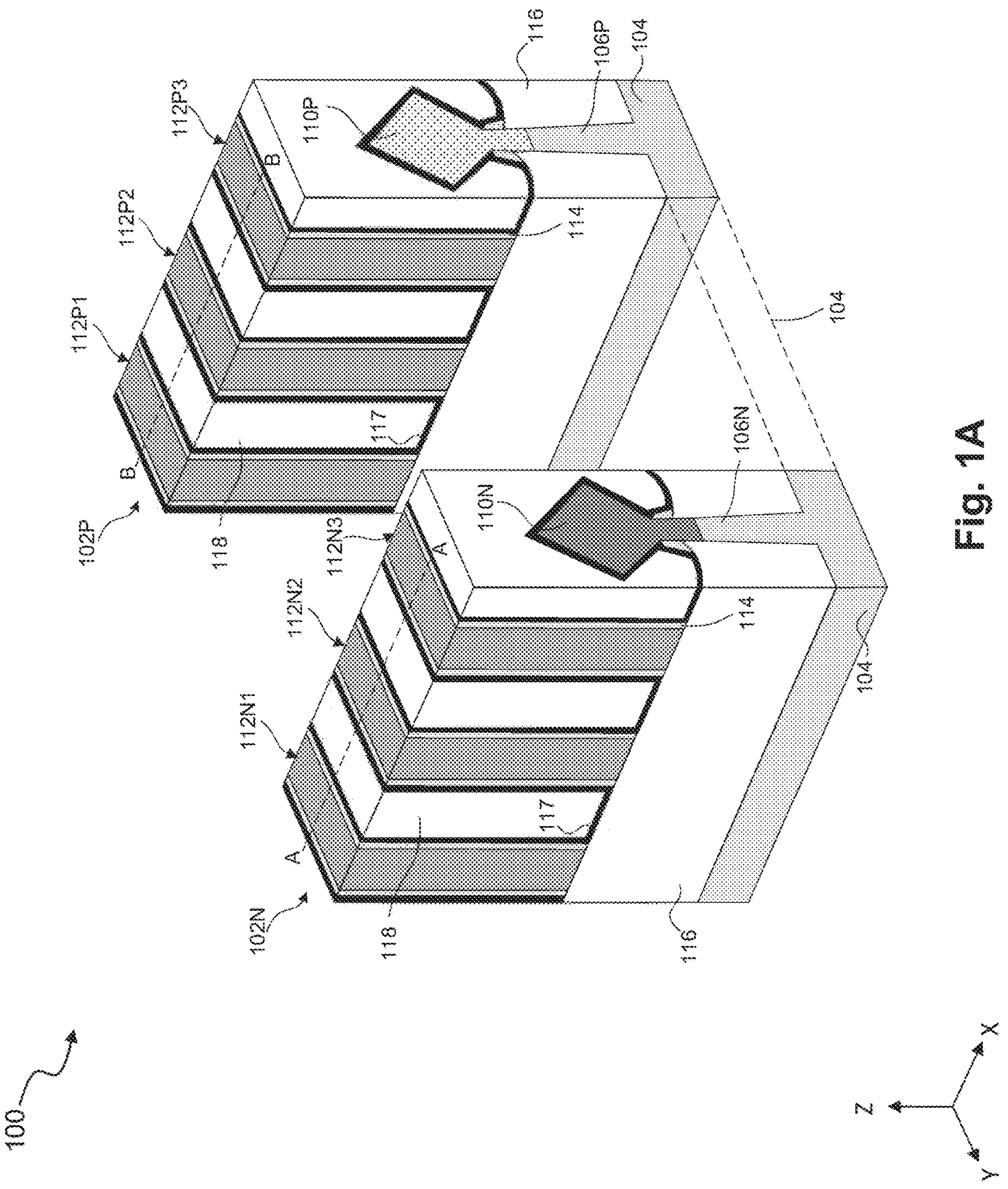
FIG. 1A illustrates an isometric view of a semiconductor device with different gate structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The GAA transistor structures may be patterned by any suitable method. For example, the structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor structure.

GAA FETs can include fin bases disposed on a substrate, stacks of nanostructured channel regions disposed on the fin bases, and gate structures surrounding each of the nanostructured channel regions. The gate voltage—the threshold voltage (Vt)—to turn on a GAA FET can depend on the semiconductor material of the nanostructured channel regions and/or the effective work function (EWF) value of the gate structures of the GAA FET. For example, for an n-type GAA FET ("NFET"), reducing the difference between the EWF value of the NFET gate structure and the conduction band energy of the material (e.g., 4.1 eV for silicon (Si) or 3.8 cV for silicon germanium (SiGe)) of the NFET nanostructured channel regions can reduce the NFET threshold voltage. For a p-type GAA FET ("PFET"), reducing the difference between the EWF value of the PFET gate structure and the valence band energy of the material (e.g., 5.2 CV for Si or 4.8 cV for SiGe) of the PFET nanostructured channel regions can reduce the PFET threshold voltage. The EWF values of the gate structures can depend on the thickness and/or material composition of each of the layers of the gate structure. As such, GAA FETs can be manufactured with different threshold voltages by adjusting the thickness and/or material composition of the gate structures.

Due to the increasing demand for multi-functional low power portable devices, there is an increasing demand for GAA FETs with low threshold voltages, such as threshold voltages between about 200 mV and about 400 mV (referred to as "low threshold voltage"), threshold voltages between about 100 mV and about 200 mV (referred to as "ultra-low threshold voltage"), and threshold voltages below about 100 mV (referred to as "extreme-low threshold voltage"). One way to achieve multi-Vt devices with low, ultra-low, and/or extreme-low threshold voltages in GAA FETs can be with different work function metal (WFM) layer thicknesses greater than about 4 nm (e.g., about 5 nm to about 10 nm) in the gate structures. However, the different WFM layer thicknesses can be constrained by the GAA FET gate structure geometries. For example, the thicknesses of the WFM layers can be constrained by the spacing between the nanostructured channel regions of the GAA FETs. And, depositing different WFM layer thicknesses can become increasingly challenging with the continuous scaling down of GAA FETs. The continuous scaling down of GAA FETs have also increased the challenges of preventing the nanostructured channel regions from being oxidized during GAA FET thermal processing. The oxidation of the nanostructured channel regions increases the thickness of interfacial oxide (IL) layers of the gate structures on the nanostructured channel regions, thus degrading the gate performance of the GAA FETs.

To address the abovementioned challenges, the present disclosure provides example methods of forming GAA FETs with improved thickness profile control of the IL layers and with different gate structures configured to provide different threshold voltages on the same substrate. The example methods form NFETs and PFETs with scaled down IL layers of about 0.4 nm to about 0.8 nm for reduced capacitance effective thickness (CET), thus increasing FET drive currents. In addition, the example methods form NFETs and PFETs with WFM layers of substantially equal thicknesses, and with extreme-low, ultra-low, and/or low threshold voltages, on the same substrate. These example methods can be more cost-effective (e.g., reduce cost by about 20% to about 30%) and time-efficient (e.g., reduce time by about 15% to about 20%) in manufacturing reliable GAA FET gate structures with different threshold voltages than other methods of forming GAA FETs with similar dimensions and threshold voltages on the same substrate. In addition, these example methods can form GAA FET gate structures with much smaller dimensions (e.g., thinner gate stacks) than other methods of forming GAA FETs with similar threshold voltages.

In some embodiments, the gate structures of the NFETs and PFETs can include diffusion barrier layers disposed on the IL layers. The diffusion barrier layers can prevent or minimize the diffusion of oxygen atoms from overlying layers (e.g., high-K (HK) gate dielectric layers) to the nanostructured channel regions during thermal processing of the NFETs and PFETs. Preventing or minimizing the diffusion of the oxygen atoms can prevent or minimize the oxidation of the nanostructured channel regions. Thus, with the use of the diffusion barrier layers, the IL layers can be adequately maintained at a thickness of about 0.4 nm to about 0.8 nm during the different thermal processes performed in the fabrication of the NFETs and PFETs. In some embodiments, for adequate thickness profile control of the IL layers, the diffusion barrier layers can include a metal oxide with a lower Gibbs free energy of formation than that of a metal oxide (e.g., hafnium oxide ($HfO_2$)) of the HK gate dielectric layers. In some embodiments, such a metal oxide of the diffusion barrier layers can include aluminum oxide ($Al_2O_3$), lanthanum oxide ($La_2O_3$), scandium oxide (Sc2O3), yttrium oxide ($Y_2O_3$), gadolinium oxide ($Gd_2O_3$), magnesium oxide (MgO), calcium oxide (CaO), or zirconium silicate ($ZrSiO_4$). In some embodiments, the diffusion barrier layers can have a thickness of about 0.3 nm to about 0.5 nm for adequately preventing or minimizing the diffusion of oxygen atoms without compromising device size and manufacturing cost.

In some embodiments, NFETs and PFETs with different gate structure configurations, but with WFM layers of substantially equal thicknesses can be formed on the same substrate to achieve different threshold voltages. The different gate structures can have the diffusion barrier layers and the HK gate dielectric layers doped with metal dopants of different types and/or concentrations. The different types and/or concentrations of metal dopants can induce dipoles of different polarities and/or concentrations at interfaces between the diffusion barrier layers and the IL layers ("barrier-IL interfaces"). The dipoles of different polarities and/or concentrations result in gate structures with different EWF values. Since EWF values of gate structures correspond to threshold voltage of NFETs and PFETs, gate structures with different EWF values result in NFETs and PFETs with different threshold voltages on the same substrate. Thus, controlling the types and/or concentrations of metal dopants in the diffusion barrier layers and the HK gate dielectric layers can tune the EWF values of the NFET and PFET gate structures, and as a result can adjust the threshold voltages of the NFETs and PFETs without varying the WFM layer thicknesses.

Figure 1B:
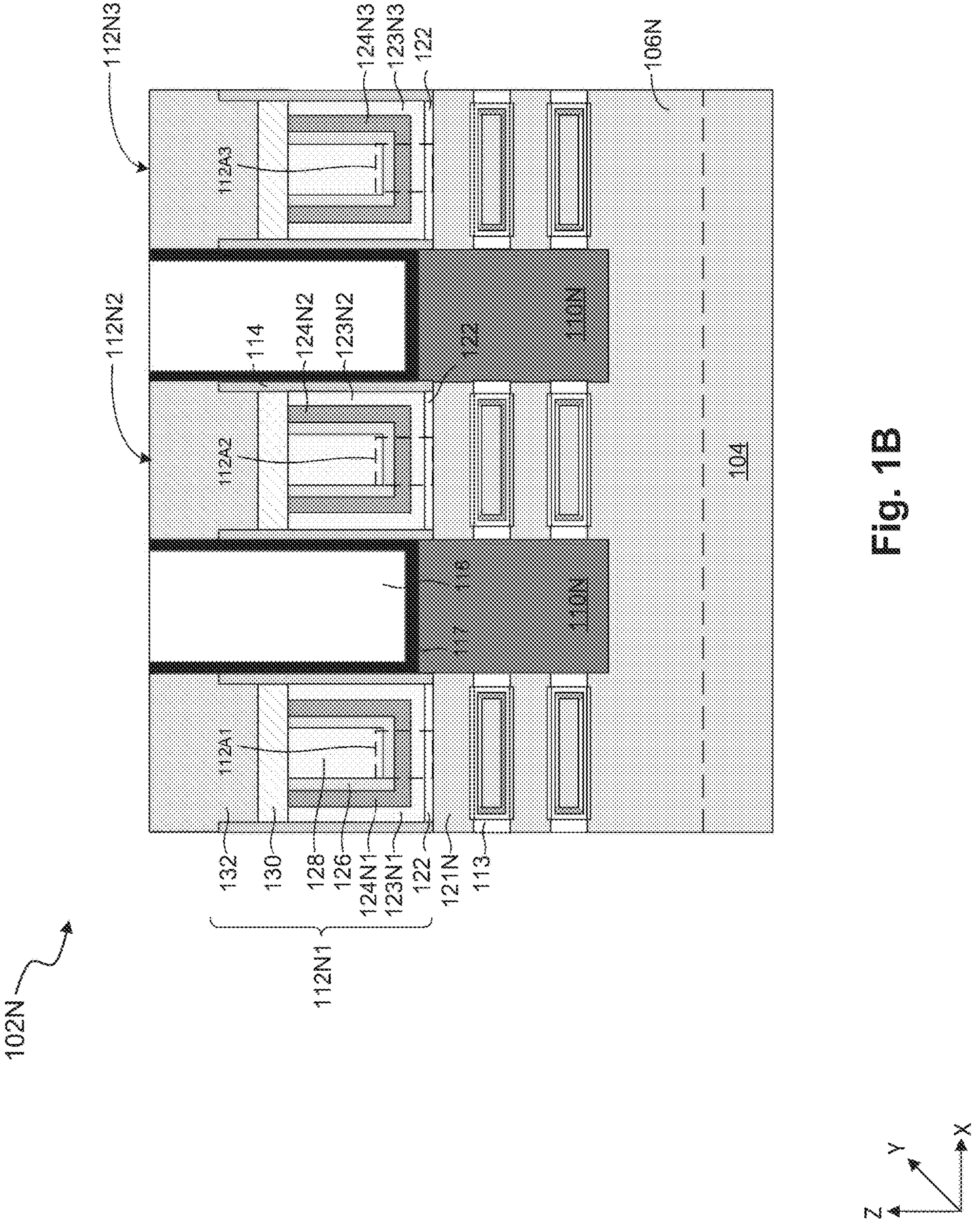
FIGS. 1B-1E illustrate cross-sectional views of a semiconductor device with different gate structures, in accordance with some embodiments.
Figure 1C:
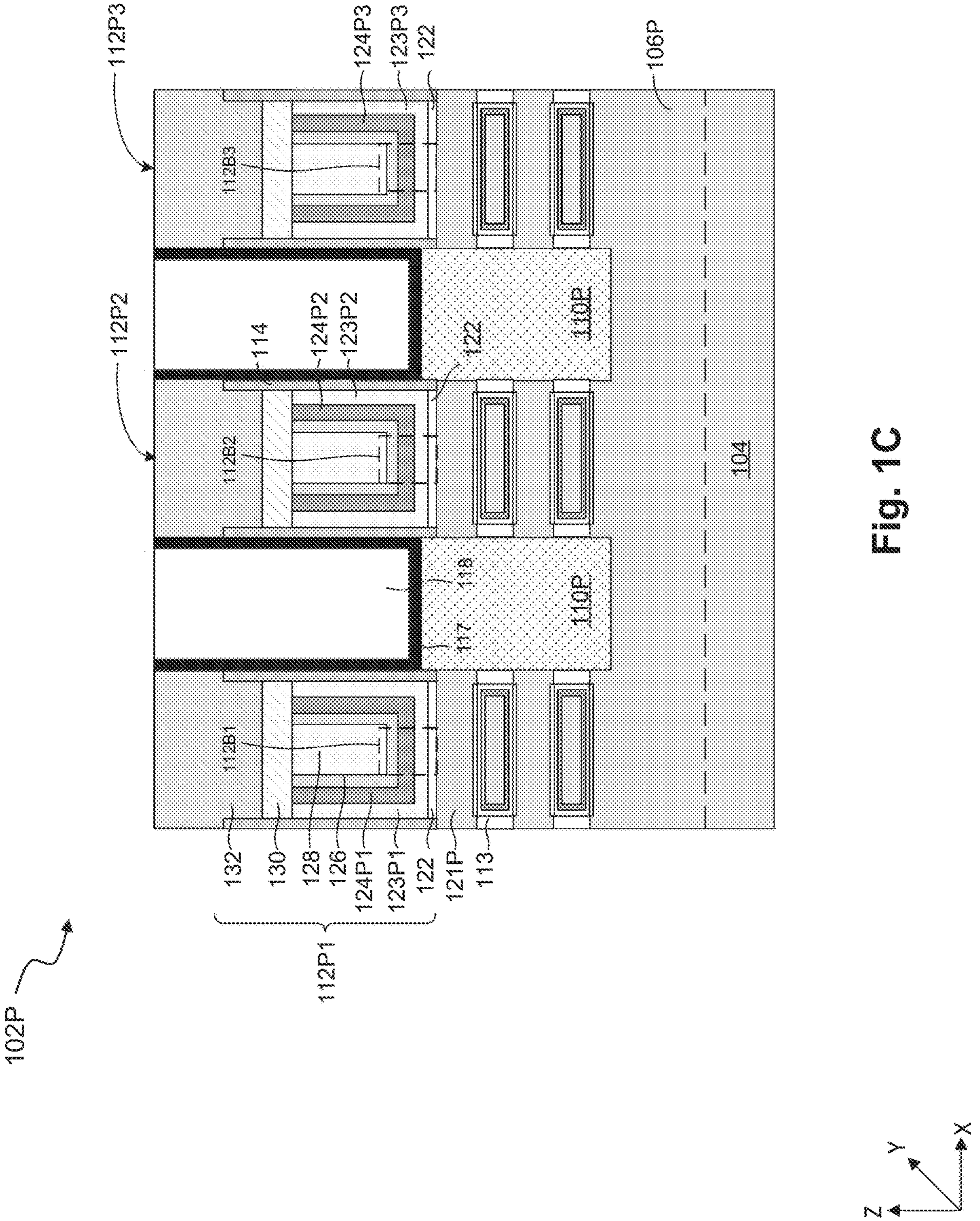
Figure 1D:
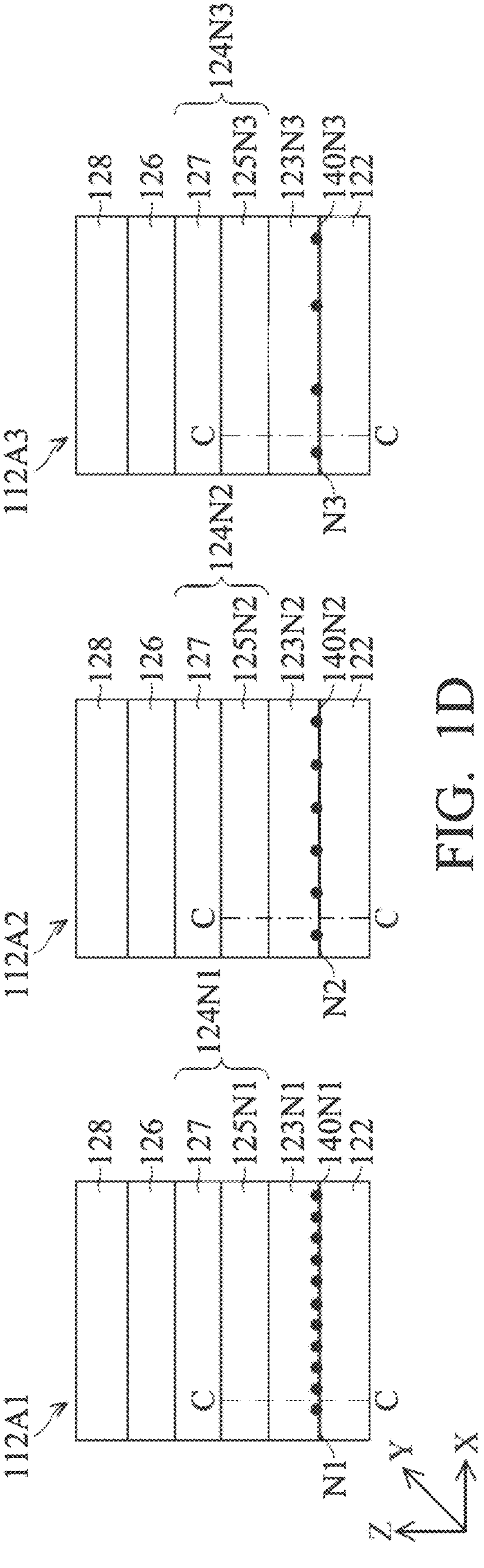
Figure 1E:
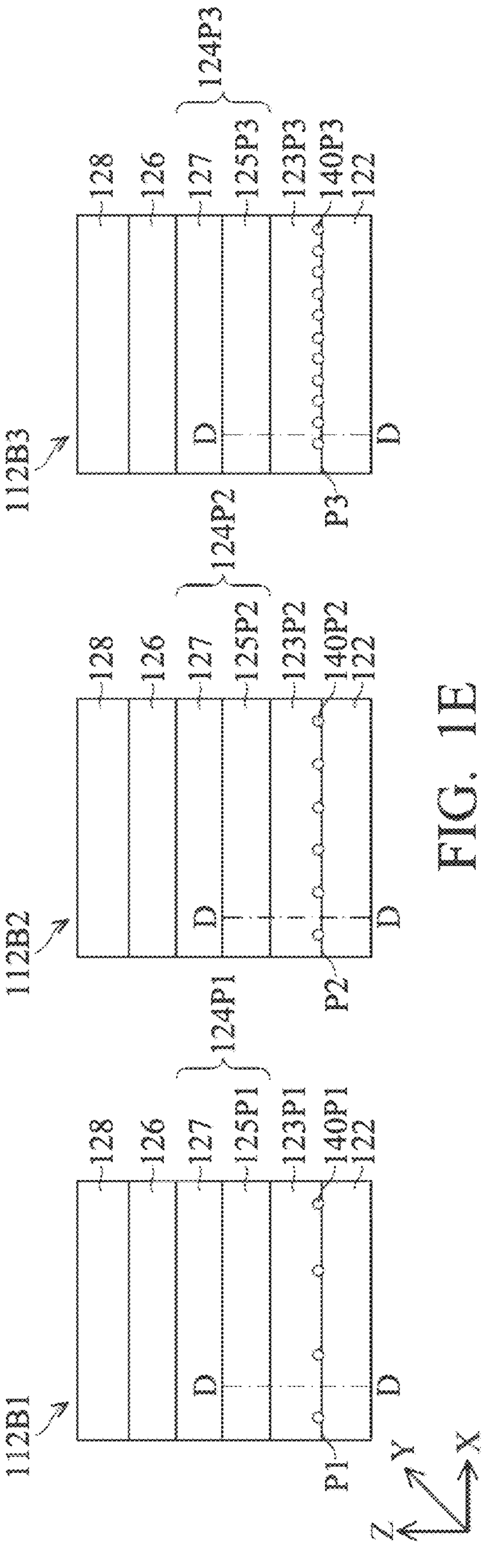

FIG. 1A illustrates an isometric view of a semiconductor device 100 with an n-type GAA FET 102N ("NFET 102N") and a p-type GAA FET 102P ("PFET 102P"), according to some embodiments. FIG. 1B illustrates a cross-sectional view of NFET 102N along line A-A of FIG. 1, according to some embodiments. FIG. 1C illustrates a cross-sectional views of PFET 102P along line B-B of FIG. 1, according to some embodiments. FIGS. 1B and 1C illustrate cross-sectional views of semiconductor device 100 with additional structures that are not shown in FIG. 1A for simplicity. FIG. 1D is an enlarged view of gate regions 112A1, 112A2, and 112A3 of FIG. 1B. FIG. 1E is an enlarged view of gate regions 112B1, 112B2, and 112B3 of FIG. 1C. FIGS. 1D and 1E illustrate additional elements that are not shown in FIGS.

1B and 1C for simplicity. The discussion of elements with the same annotations applies to each other, unless mentioned otherwise.

Referring to FIGS. 1A-1C, in some embodiments, semiconductor device 100 can be formed on a substrate 104 with NFET 102N and PFET 102P formed on different regions of substrate 104. There may be other FETs and/or structures (e.g., isolation structures) formed between NFET 102N and PFET 102P on substrate 104. Substrate 104 can be a semiconductor material, such as Si, germanium (Ge), SiGe, a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). Semiconductor device 100 can further include gate spacers 114, shallow trench isolation (STI) regions 116, etch stop layers (ESLs) 117, and interlayer dielectric (ILD) layers 118. In some embodiments, gate spacers 114, STI regions 116, ESLs 117, and ILD layers 118 can include an insulating material, such as silicon oxide ($SiO_2$), silicon nitride (SiN), silicon carbon nitride (SiCN), silicon oxycarbon nitride (SiOCN), and silicon germanium oxide.

Referring to FIGS. 1A and 1B, in some embodiments, NFET 102N can include (i) a fin base 106N, (ii) source/drain (S/D) regions 110N disposed on fin base 106N, (iii) gate structures 112N1-112N3 disposed on portions of fin base 106N that are not covered by S/D regions 110N, and (iv) nanostructured channel regions 121N surrounded by gate structures 112N1-112N3. Referring to FIGS. 1A and 1C, in some embodiments, PFET 102P can include (i) a fin base 106P, (ii) source/drain (S/D) regions 110P disposed on fin base 106P, (iii) gate structures 112P1-112P3 disposed on portions of fin base 106P that are not covered by S/D regions 110P, and (iv) nanostructured channel regions 121P surrounded by gate structures 112P1-112P3. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm. In some embodiments, nanostructured channel regions 121 can be in the form of nanosheets, nanowires, nanorods, nanotubes, or other suitable nanostructured shapes. In some embodiments, fin bases 106N and 106P can include a material similar to substrate 104 and extend along an X-axis.

In some embodiments, S/D regions 110N can include an epitaxially-grown semiconductor material, such as Si, and n-type dopants, such as phosphorus and other suitable n-type dopants. In some embodiments, S/D regions 110P can include an epitaxially-grown semiconductor material, such as Si and SiGe, and p-type dopants, such as boron and other suitable p-type dopants.

In some embodiments, nanostructured channel regions 121N and 121P can include semiconductor materials similar to or different from substrate 104. In some embodiments, nanostructured channel regions 121N and 121P can include Si, silicon arsenide (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 121N and 121P are shown, nanostructured channel regions 121N and 121P can have cross-sections of other geometric shapes (e.g., circular, elliptical, triangular, or polygonal). In some embodiments, nanostructured channel regions 121N and 121P can be separated from each other along a Z-axis by a distance of about 8 nm to about 12 nm. In some embodiments, each of nanostructured channel regions 121N and 121P can have a thickness of about 5 nm to about 8 nm along a Z-axis. In some embodiments, each of nanostructured channel regions 121N and 121P can have a width of about 15 nm to about 50 nm along an X-axis. In some embodiments, NFET-PFET 102N-102P can be finFETs and have fin regions (not shown) instead of nanostructured channel regions 121.

In some embodiments, the portions of gate structures 112N1-112N3 surrounding nanostructured channel regions 121N can be electrically isolated from adjacent S/D regions 110N by inner spacers 113. Similarly, the portions of gate structures 112P1-112P3 surrounding nanostructured channel regions 121P can be electrically isolated from adjacent S/D regions 110P by inner spacers 113. Inner spacers 113 can include a material similar to gate spacers 114. In some embodiments, NFET 102N and PFET 102P can be finFETs and have fin regions (not shown) instead of nanostructured channel regions 121N and 121P.

Referring to FIGS. 1B and 1D, in some embodiments, gate structures 112N1-112N3 and 112P1-112P3 can be multi-layered structures. In some embodiments, gate structures 112N1-112N3 can include (i) IL layers 122, (ii) diffusion barrier layers 123N1-123N3 disposed on IL layers 122, (iii) HK gate dielectric layers 124N1-124N3 disposed on diffusion barrier layers 123N1-123N3, (iv) WFM layers 126 disposed on HK gate dielectric layers 124N1-124N3, (v) gate metal fill layers 128 disposed on WFM layers 126, (vi) conductive capping layers 130 disposed on HK gate dielectric layers 124N1-124N3, WFM layers 126, and gate metal fill layers 128, and (vii) insulating capping layers 132 disposed on conductive capping layers 130.

Referring to FIGS. 1C and 1E, in some embodiments, gate structures 112P1-112P3 can include (i) IL layers 122, (ii) diffusion barrier layers 123P1-123P3 disposed on IL layers 122, (iii) HK gate dielectric layers 124P1-124P3 disposed on diffusion barrier layers 123P1-123P3, (iv) WFM layers 126 disposed on HK gate dielectric layers 124P1-124P3, (v) gate metal fill layers 128 disposed on WFM layers 126, (vi) conductive capping layers 130 disposed on HK gate dielectric layers 124P1-124P3, WFM layers 126, and gate metal fill layers 128, and (vii) insulating capping layers 132 disposed on conductive capping layers 130.

Referring to FIGS. 1B-1E, in some embodiments, IL layers 122 can include $SiO_2$, silicon germanium oxide ($SiGeO_x$), or germanium oxide ($GeO_2$). In some embodiments, IL layers 122 can have a thickness of about 0.4 nm to about 0.8 nm. Within this thickness range of IL layers 122, adequate CET for high FET drive current and low leakage current can be obtained without compromising device size and manufacturing cost. As IL layers 122 are disposed on nanostructured channel regions 121N and 121P, the thickness profile of IL layers 122 are susceptible to the oxidation of nanostructured channel regions 121N and 121P during the fabrication of NFET 102N and PFET 102P. Such oxidation of nanostructured channel regions 121N and 121P can be prevented or minimized with the use diffusion barrier layers 123N1-123N3 and 123P1-123P2 on IL layers 122.

Diffusion barrier layers 123N1-123N3 and 123P1-123P2 can prevent or minimize the diffusion of oxygen atoms from overlying layers (e.g., HK gate dielectric layers 124N1-124N3 and 124P1-124P3) to nanostructured channel regions 121N and 121P during thermal processing of NFET 102N and PFET 102P. Preventing or minimizing the diffusion of the oxygen atoms can prevent or minimize the oxidation of nanostructured channel regions 121N and 121P. As a result, with the use of diffusion barrier layers 123N1-123N3 and 123P1-123P2, IL layers 122 can be adequately maintained at a thickness of about 0.4 nm to about 0.8 nm during the different thermal processes performed in the fabrication of NFET 102N and PFET 102P.

Figure 1F:
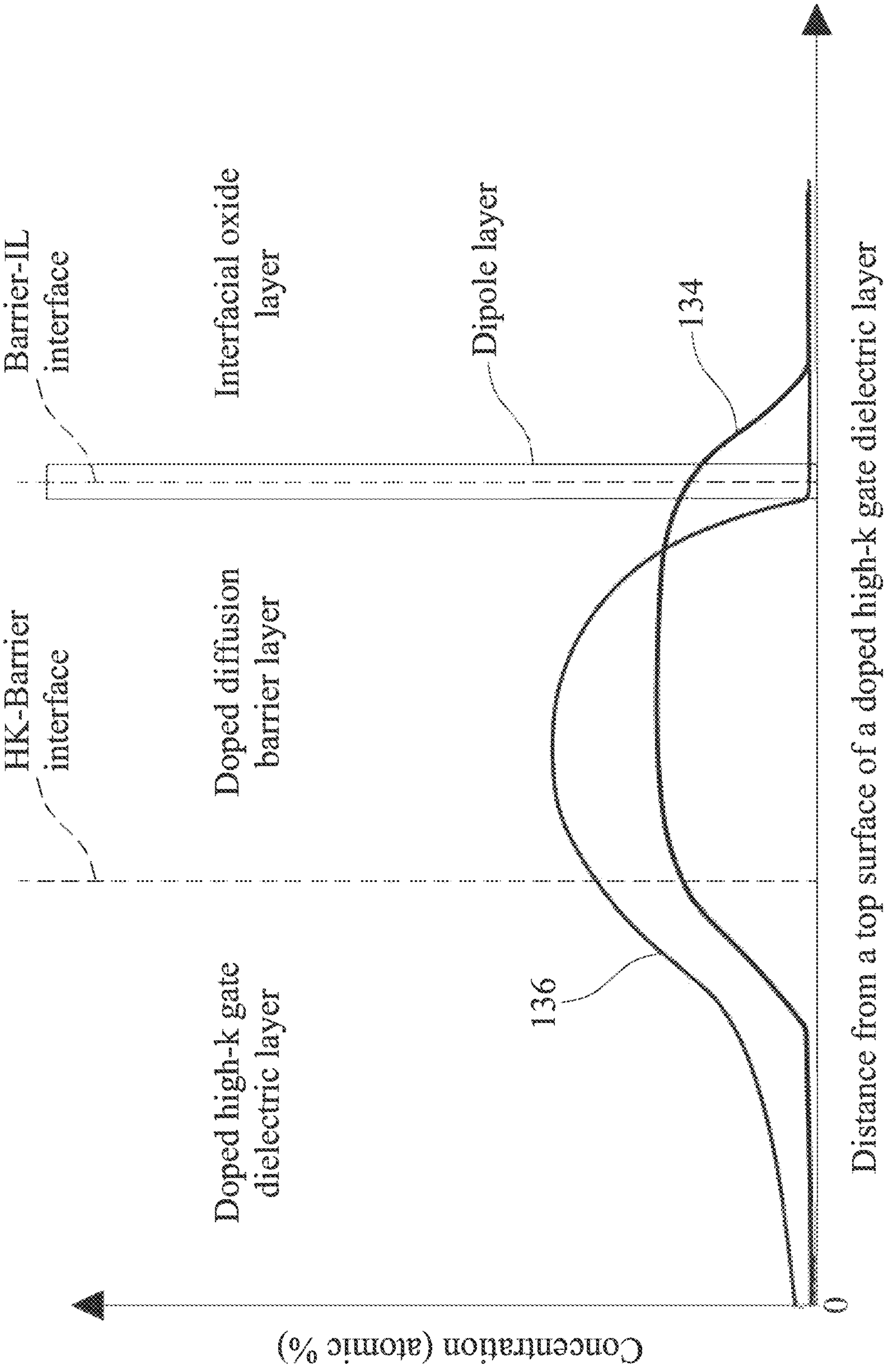
FIG. 1F illustrates device characteristics of a semiconductor device with different gate structures, in accordance with some embodiments.

In some embodiments, for adequate thickness profile control of IL layers 122, diffusion barrier layers 123N1-123N3 and 123P1-123P2 can include a metal oxide with a lower Gibbs free energy of formation than that of a metal oxide (e.g., hafnium oxide ($HfO_2$)) of the HK gate dielectric layers 124N1-124N3 and 124P1-124P3. In some embodiments, the metal oxide of diffusion barrier layers 123N1-123N3 and 123P1-123P2 can include $Al_2O_3$, $La_2O_3$, $Sc_2O_3$, $Y_2O_3$, $Gd_2O_3$, MgO, CaO, or $ZrSiO_4$. In some embodiments, the metal atoms of the metal oxide of diffusion barrier layers 123N1-123N3 and 123P1-123P2 can have a concentration profile 134, as shown in FIG. 1F, across lines C-C of FIG. 1D and lines D-D of FIG. 1E. Small distributions of the metal atoms of the metal oxide of diffusion barrier layers 123N1-123N3 and 123P1-123P2 can be present as metal dopants in IL layers 122 and HK gate dielectric layers 124N1-124N3 and 124P1-124P3, as shown in FIG. 1F. These metal dopants can diffuse into IL layers 122 and HK gate dielectric layers 124N1-124N3 and 124P1-124P3 from diffusion barrier layers 123N1-123N3 and 123P1-123P2 during the fabrication of gate structures 112N1-112N3 and 112P1-112P3, as described in detail below. In some embodiments, diffusion barrier layers 123N1-123N3 and 123P1-123P2 can have a thickness of about 0.3 nm to about 0.5 nm for adequately preventing or minimizing the diffusion of oxygen atoms without compromising device size and manufacturing cost.

Referring to FIGS. 1B-1E, in some embodiments, HK gate dielectric layers 124N1-124N3 and 124P1-124P3 can include (i) doped HK gate dielectric layer 125N1-125N3 and 125P1-125P3, and (ii) undoped HK gate dielectric layers 127 disposed on doped HK gate dielectric layer 125N1-125N3 and 125P1-125P3. In some embodiments, doped HK gate dielectric layer 125N1-125N3 and 125P1-125P3 and undoped HK gate dielectric layers 127 can include a high-k dielectric material, such as $HfO_2$, titanium oxide ($TiO_2$), hafnium zirconium oxide (HfZrO), tantalum oxide ($Ta_2O_3$), or hafnium silicate ($HfSiO_4$).

Referring to FIG. 1D, diffusion barrier layers 123N1-123N3 and doped HK gate dielectric layers 125N1-125N3 can further include metal dopants that induce the formation of dipole layers 140N1-140N3 with n-type dipoles ("N-dipoles") at barrier-IL interfaces N1-N3. In some embodiments, dipole layers 140N1-140N3 can be disposed in diffusion barrier layers 123N1-123N3 and closer to barrier-IL interfaces N1-N3, instead of at barrier-IL interfaces N1-N3. In some embodiments, the metal dopants for N-dipoles in diffusion barrier layers 123N1-123N3 and doped HK gate dielectric layers 125N1-125N3 can include rare-earth metals (REMs), such as lanthanum (La), yttrium (Y), cerium (Ce), ytterbium (Yb), and erbium (Er). In some embodiments, N-dipoles of dipole layers 140N1-140N3 can include metal ions from metal dopants in diffusion barrier layers 123N1-123N3 and oxygen ions from the material of IL layers 122 of NFET 102N.

In some embodiments, diffusion barrier layers 123N1-123N3 and doped HK gate dielectric layers 125N1-125N3 can include metal dopants of the same metal, but with concentrations different from each other to induce N-dipoles in dipole layers 140N1-140N3 of the same type and with concentrations different from each other. As metal dopant concentration is directly proportional to N-dipole concentration, which is inversely proportional to threshold voltage of an NFET gate structure, (i) diffusion barrier layer 123N1 and doped HK gate dielectric layer 125N1 have higher concentrations of metal dopants than that in diffusion barrier layers 123N2-123N3 and doped HK gate dielectric layers 125N2-125N3 to form gate structure 112N1 with a threshold voltage smaller than that of gate structures 112N2 and 112N3, and (ii) diffusion barrier layer 123N2 and doped HK gate dielectric layer 125N2 have higher concentrations of metal dopants than that in diffusion barrier layer 123N3 and doped HK gate dielectric layer 125N3 to form gate structure 112N2 with a threshold voltage smaller than that of gate structure 112N3. Thus, threshold voltages across different NFET gate structures (e.g., gate structures 112N1-112N3) on the same substrate can be varied with different concentrations of the same polarity dipoles (e.g., N-dipoles). In some embodiments, the metal dopants in diffusion barrier layers 123N1-123N3 and doped HK gate dielectric layer 125N1-125N3 can have a dopant concentration profile 136 across lines C-C of FIG. 1D, as shown in FIG. 1F. The concentration of metal dopants for N-dipoles in diffusion barrier layers 123N1-123N3 can be higher than that in doped HK gate dielectric layers 125N1-125N3. The peak concentration of the metal dopants for N-dipoles can be in diffusion barrier layers 123N1-123N3 and closer to barrier-IL interfaces N1-N3, as shown in FIG. 1F.

Referring to FIG. 1E, diffusion barrier layers 123P1-123P3 and doped HK gate dielectric layers 125P1-125P3 can further include metal dopants that induce the formation of dipole layers 140P1-140P3 with P-dipoles at barrier-IL interfaces P1-P3. In some embodiments, dipole layers 140P1-140P3 can be disposed in diffusion barrier layers 123P1-123P3 and closer to barrier-IL interfaces P1-P3, instead of at barrier-IL interfaces P1-P3. In some embodiments, the metal dopants in diffusion barrier layers 123P1-123P3 and doped HK gate dielectric layer 125P1-125P3 can include zinc (Zn), germanium (Ge), aluminum (Al), titanium (Ti), or vanadium (V). In some embodiments, P-dipoles of dipole layers 140P1-140P3 can include metal ions from metal dopants in diffusion barrier layers 123P1-123P3 and oxygen ions from the material of IL layers 122 of PFET 102P.

In some embodiments, diffusion barrier layers 123P1-123P3 and doped HK gate dielectric layer 125P1-125P3 can include metal dopants of the same metal, but with concentrations different from each other to induce P-dipoles in dipole layers 140P1-140P3 of the same type and with concentrations different from each other. As metal dopant concentration is directly proportional to P-dipole concentration, which is inversely proportional to threshold voltage of a PFET gate structure, (i) diffusion barrier layer 123P3 and doped HK gate dielectric layer 125P3 have higher concentrations of metal dopants than that in diffusion barrier layers 123P1-123P2 and doped HK gate dielectric layers 125P1-125P2 to form gate structure 112P3 with a threshold voltage smaller than that of gate structures 112P1 and 112P2, and (ii) diffusion barrier layer 123P2 and doped HK gate dielectric layer 125P2 have higher concentrations of metal dopants than that in diffusion barrier layer 123P1 and doped HK gate dielectric layer 125P1 to form gate structure 112P2 with a threshold voltage smaller than that of gate structure 112P1. Thus, threshold voltages across different PFET gate structures (e.g., gate structures 112P1-112P3) on the same substrate can be varied with different concentrations of the same polarity dipoles (e.g., P-dipoles). In some embodiments, the metal dopants in diffusion barrier layers 123P1-123P2 and doped HK gate dielectric layer 125P1-125P2 can have a dopant concentration profile 136 across lines D-D of FIG. 1E, as shown in FIG. 1F. The concentration of metal dopants for P-dipoles in diffusion barrier layers 123P1-123P2 can be higher than that in doped HK gate dielectric layers 125P1-125P2. The peak concentration of the metal dopants for P-dipoles can be in diffusion barrier layers 123P1-123P2 and closer to barrier-IL interfaces P1-P3, as shown in FIG. 1F.

In some embodiments, WFM layers 126 of gate structures 112N1-112N3 and 112P1-112P3 can include the same n-type WFM ("nWFM") layers 126 or p-type WFM ("pWFM") layers 126. In some embodiments, WFM layers 126 of gate structures 112N1-112N3 can include nWFM 126 and gate structures 112P1-112P3 can include pWFM 126. The nWFM layers 126 can include a metal or a metal-containing material with a work function value closer to a conduction band energy than a valence band energy of a material of nanostructured channel regions 121N-121P. In some embodiments, nWFM layers 126 can have a work function value less than about 4.5 eV. The pWFM layers 126 can include a metal or a metal-containing material with a work function value closer to a valence band energy than a conduction band energy of a material of nanostructured channel regions 121N-121P. In some embodiments, pWFM layers 126 can have a work function value equal to or greater than about 4.5 cV.

In some embodiments, nWFM layers 126 can include titanium aluminum (TiAl), titanium aluminum carbide (TiAlC), tantalum aluminum (TaAl), tantalum aluminum carbide (TaAlC), Al-doped Ti, Al-doped TIN, Al-doped Ta, Al-doped TaN, or other suitable Al-based materials. In some embodiments, pWFM layers 126 can include substantially Al-free (e.g., with no Al) metals, metal nitrides, or metal alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), molybdenum nitride (MoN), molybdenum (Mo), and tungsten (W).

In some embodiments, gate metal fill layers 128 can include a suitable conductive material, such as W, Ti, Al, Mo, silver (Ag), ruthenium (Ru), copper (Cu), cobalt (Co), iridium (Ir), nickel (Ni), metal alloys, and a combination thereof. Insulating capping layers 132 can protect the underlying conductive capping layers 130 from structural and/or compositional degradation during subsequent processing of the semiconductor device 100. In some embodiments, insulating capping layers 132 can include a nitride material, such as SiN, and can have a thickness of about 5 nm to about 10 nm for adequate protection of the underlying conductive capping layers 130. Conductive capping layers 130 can provide conductive interfaces between gate metal fill layers 128 and gate contact structures (not shown) to electrically connect gate metal fill layers 128 to gate contact structures without forming gate contact structures directly on or within gate metal fill layers 128. In some embodiments, conductive capping layers 130 can include a metallic material, such as W, Ru, Ir, Mo, and a combination thereof, or other suitable metallic materials.

Figure 2:
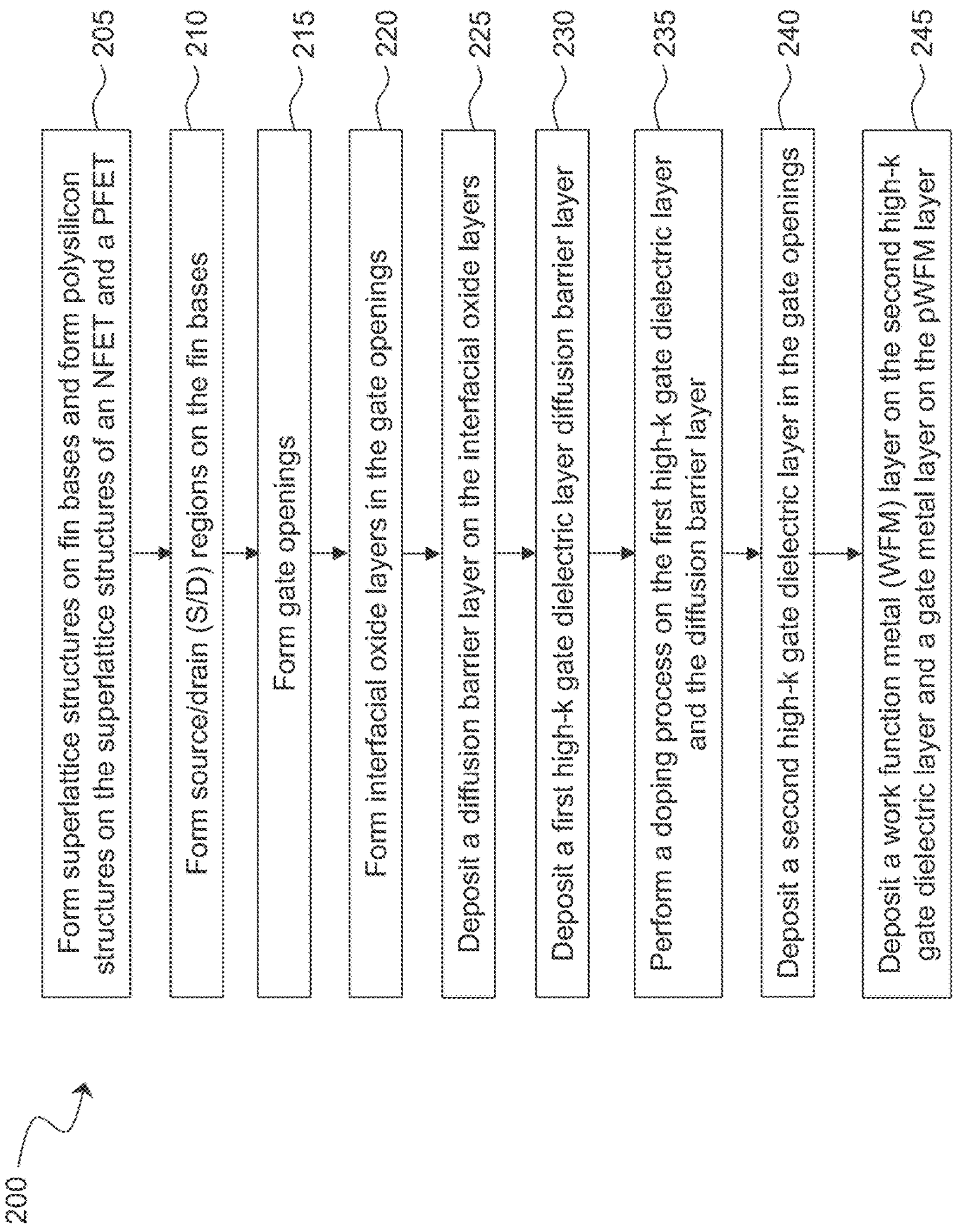
FIG. 2 is a flow diagram of a method for fabricating a semiconductor device with different gate structures, in accordance with some embodiments.

FIG. 2 is a flow diagram of an example method 200 for fabricating NFET 102N and PFET 102P, according to some embodiments. For illustrative purposes, the operations illustrated in FIG. 2 will be described with reference to the example fabrication process for fabricating NFET 102N and PFET 102P as illustrated in FIGS. 3A-20B. FIGS. 3A-20A are cross-sectional views of NFET 102N along line A-A of FIG. 1A, and FIGS. 3B-20B are cross-sectional views of PFET 102P along line B-B of FIG. 1A at various stages of fabrication, according to some embodiments. Operations can be performed in a different order or not performed depending on specific applications. It should be noted that method 200 may not produce a complete NFET 102N and PFET 102P. Accordingly, it is understood that additional processes can be provided before, during, and after method 200, and that some other processes may only be briefly described herein. Elements in FIGS. 3A-20B with the same annotations as elements in FIGS. 1A-1E are described above.

Referring to FIG. 2, in operation 205, superlattice structures are formed on fin bases, and polysilicon structures are formed on the superlattice structures for an NFET and a PFET. For example, as described with reference to FIGS. 3A and 3B, superlattice structures 320N and 320P are formed on fin bases 106N and 106P, respectively, and polysilicon structures 312N and 312P are formed on superlattice structures 320N and 320P, respectively. Superlattice structures 320N can include nanostructured layers 121N and 321 arranged in an alternating configuration. Similarly, superlattice structures 320P can include nanostructured layers 121P and 321 arranged in an alternating configuration. In some embodiments, nanostructured layers 321 include materials different from nanostructured layers 121N and 121P. Nanostructured layers 321 are also referred to as "sacrificial layers 321." During subsequent processing, polysilicon structures 312N and 312P and sacrificial layers 321 can be replaced in a gate replacement process to form gate structures 112N1-112N3 and 112P1-112P3.

Figure 3A:
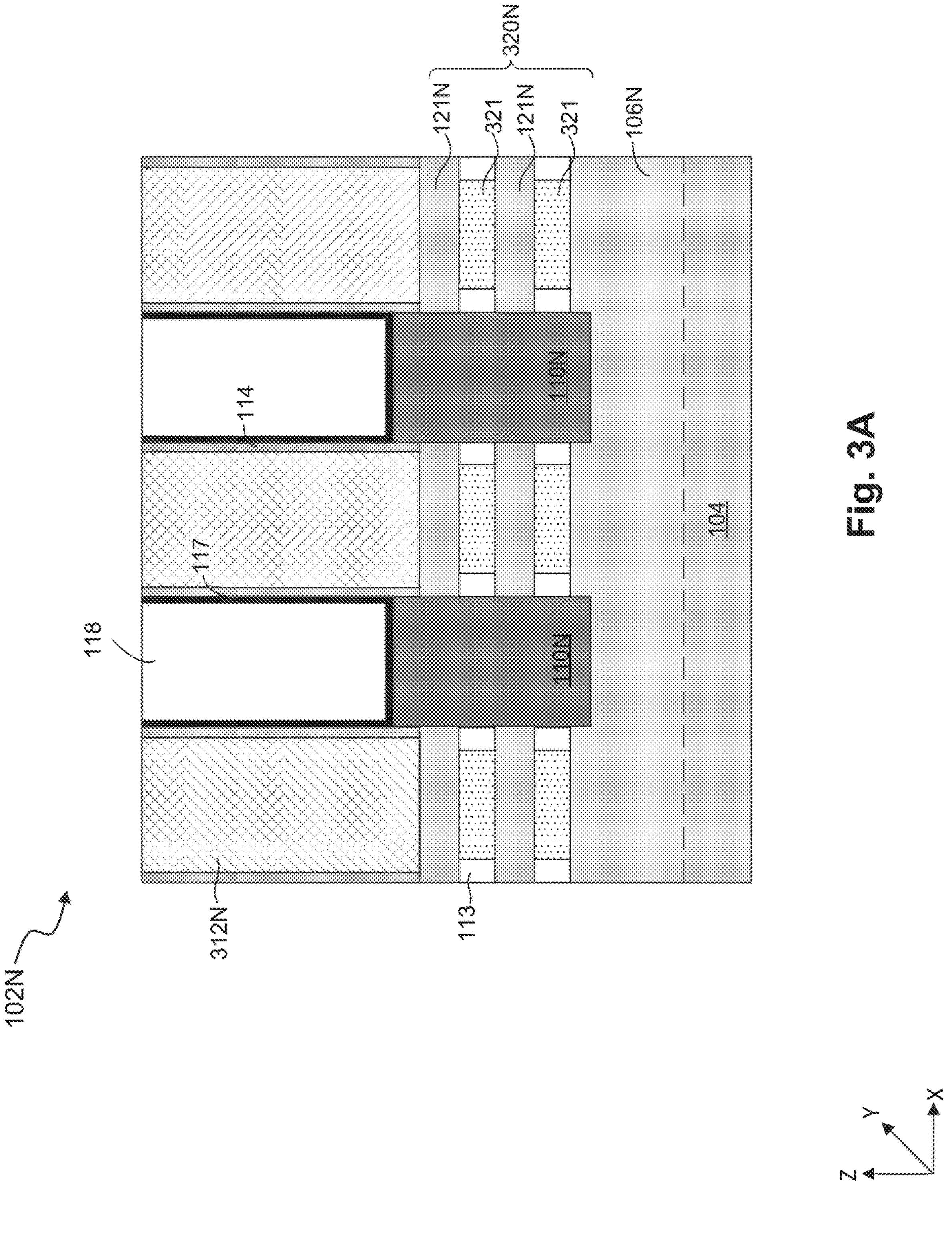
FIGS. 3A-20B illustrate cross-sectional views of a semiconductor device with different gate structures at various stages of its fabrication process, in accordance with some embodiments.
Figure 3B:
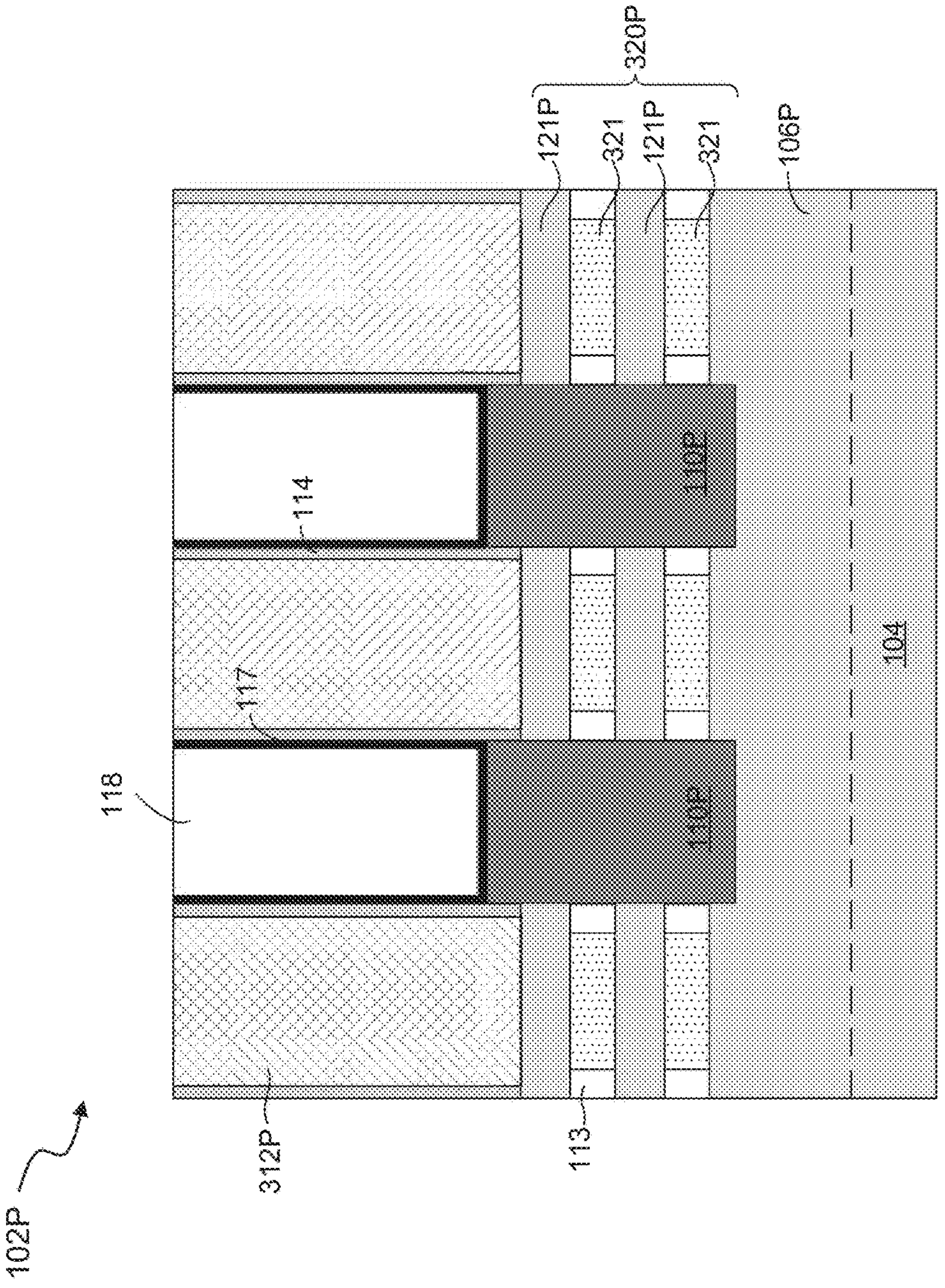
Figure 4A:
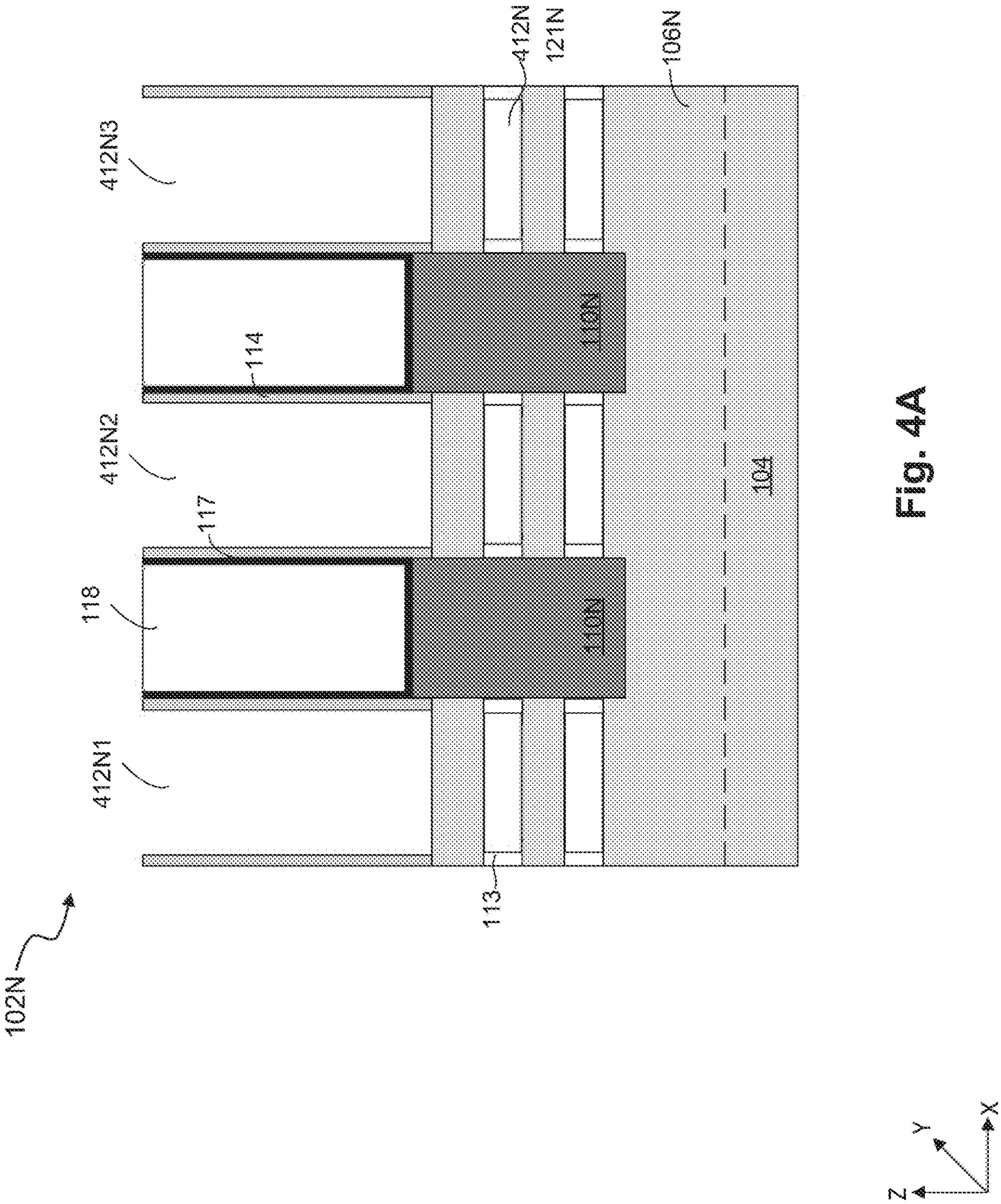
Figure 4B:
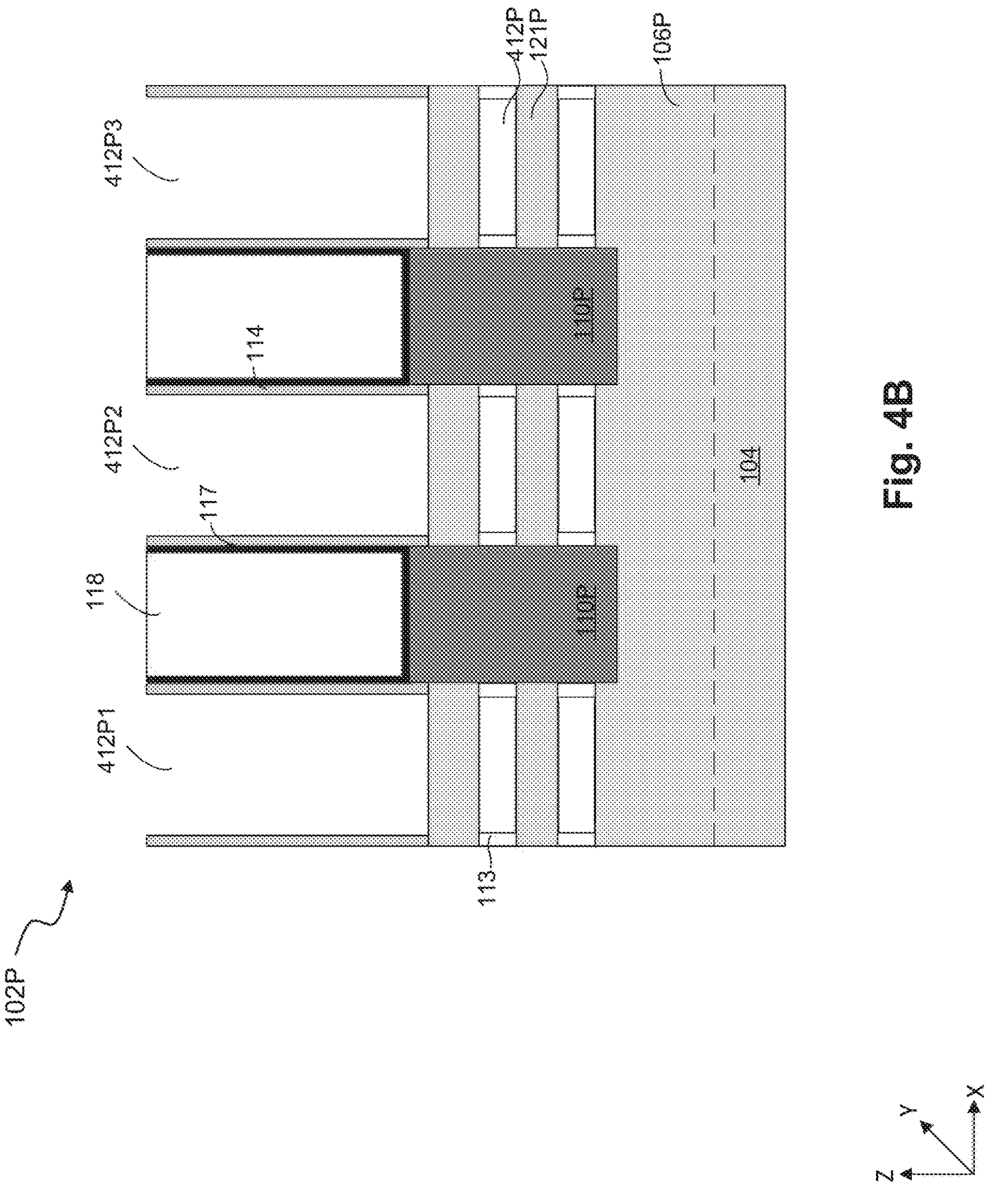

Referring to FIG. 2, in operation 210, S/D regions are formed on the fin bases. For example as described with reference to FIGS. 3A and 3B, S/D regions 110N and 110P are formed on fin bases 106N and 106P, respectively. In some embodiments, S/D regions 110N and 110P can be epitaxially grown on fin bases 106N and 106P. Prior to the formation of S/D regions 110N and 110P, inner spacers 113 can be formed in superlattice structures 320N and 320P, as shown in FIGS. 3A and 3B. After the formation of S/D regions 110N and 110P, ESL 117 and ILD layer 118 can be formed, as shown in FIGS. 3A and 3B.

Referring to FIG. 2, in operation 215, gate openings are formed. For example, as described with reference to FIGS. 4A and 4B, gate openings 412N1-412N3 and 412P1-412P3 are formed. Gate openings 412N1-412N3 and 412P1-412P3 can be formed by removing polysilicon structures 312N and 312P and sacrificial layers 321 from the structures of FIGS. 3A and 3B.

Referring to FIG. 2, in operation 220, IL layers are formed in the gate openings. For example, as described with reference to FIGS. 5A and 5B, IL layers 122 are formed in gate openings 412N1-412N3 and 412P1-412P3. In some embodiments, IL layers 122 can be formed by performing a wet oxidation process on the exposed surfaces of nanostructured channel regions 121N and 121P and fin bases 106N and 106P in gate openings 412N1-412N3 and 412P1-412P3. The wet oxidation process can oxidize top portions of nanostructured channel regions 121N-121P and fin bases 106N-106P to form IL layers 122.

In some embodiments, the wet oxidation process can include exposing the surfaces of nanostructured channel regions 121N and 121P and fin bases 106N and 106P in gate openings 412N1-412N3 and 412P1-412P3 to an oxidizing solution mixture of diluted hydrochloric acid (HCl), hydrogen peroxide ($H_2O_2$), and deionized (DI) water for a time period of about 20 seconds to about 100 seconds. In some embodiments, the volumetric ratio between diluted HCl, $H_2O_2$, and DI water (HCl:$H_2O_2$:DI) in the oxidizing solution mixture can be about 1:1:50 to about 2:1:100. Within this range of volumetric ratio of HCl, $H_2O_2$, and DI, the growth of IL layers 122 can be adequately controlled to achieve a thickness of about 0.4 to about 0.8 nm with a higher film density than that achieved with other oxidation processes. In addition, within this range of volumetric ratio, IL layers 122 can be grown with reduced oxygen trap densities at the interfaces between IL layers 122 and nanostructured channel regions 121N-121P and between IL layers 122 and HK gate dielectric layers 124N1-124N3 and 124P1-124P3 compared to that achieved with other oxidation processes. The reduced interfacial oxygen trap densities can reduce device current leakage and improve gate performance.

Referring to FIG. 2, in operation 225, a diffusion barrier layer is deposited on the IL layers. For example, as described with reference to FIGS. 5A and 5B, a diffusion barrier layer 523 with diffusion barrier layer portions ("barrier portions") 523N1-523N3 and 523P1-523P3 are deposited on IL layers 122 in gate openings 412N1-412N3 and 412P1-412P3. In subsequent processing, barrier portions 523N1-523N3 and 523P1-523P3 form diffusion barrier layers 123N1-123N3 and 123P1-123P3. The deposition of diffusion barrier layer 523 can include depositing a metal oxide, which includes a metal oxide with a lower Gibbs free energy of formation than that of a metal oxide (e.g., $HfO_2$) in HK gate dielectric layers 124N1-124N3 and 124P1-124P3. In some embodiments, depositing the metal oxide can include depositing a layer of $Al_2O_3$, $La_2O_3$, $Sc_2O_3$, $Y_2O_3$, $Gd_2O_3$, MgO, CaO, or $ZrSiO_4$ on IL layers 122 in a chemical vapor deposition (CVD) process or an atomic layer deposition (ALD) process. In some embodiments, depositing the metal oxide can include depositing the metal oxide with a thickness of about 0.3 nm to about 0.5 nm on IL layers 122 to adequately prevent the oxidation of nanostructured channel regions 121N-121P and fin bases 106N-106P without compromising device manufacturing cost.

Referring to FIG. 2, in operation 230, a first HK gate dielectric layer is deposited on the diffusion barrier layer. For example, as described with reference to FIGS. 5A and 5B, a first HK gate dielectric layer 525 with HK gate dielectric layer portions ("HK portions") 525N1-525N3 and 525P1-525P3 are deposited on diffusion barrier layer 523 in gate openings 412N1-412N3 and 412P1-412P3. In subsequent processing, HK portions 525N1-525N3 and 525P1-525P3 form doped HK gate dielectric layers 125N1-125N3 and 125P1-125P3. The deposition of first HK dielectric layer 525 can include depositing a layer of high-k dielectric material, such as $HfO_2$, $TiO_2$, HfZrO, $Ta_2O_3$, $HfSiO_4$, $ZrO_2$, and $ZrSiO_2$ with a thickness of about 1 nm to about 2 nm.

Figure 5A:
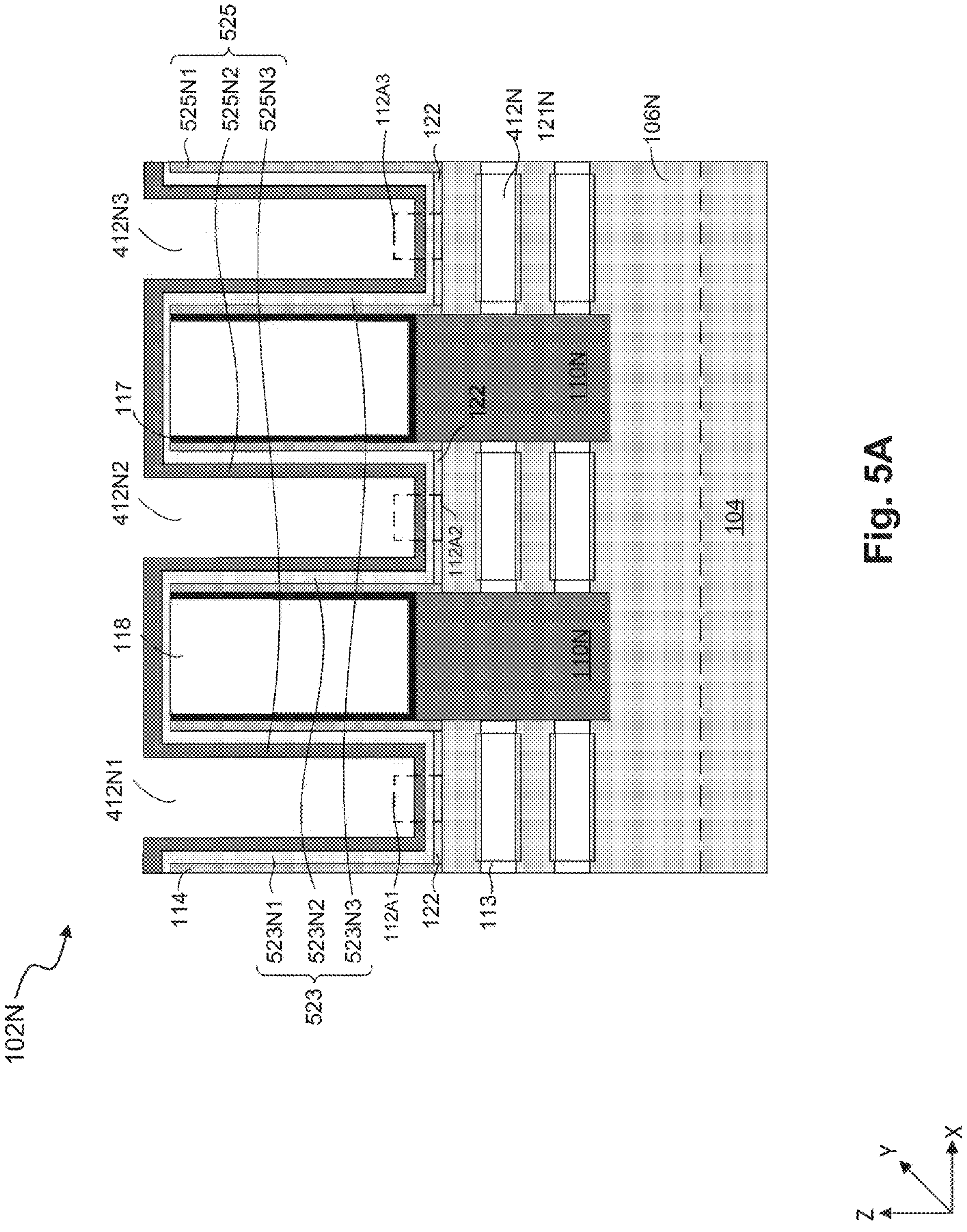
Figure 5B:
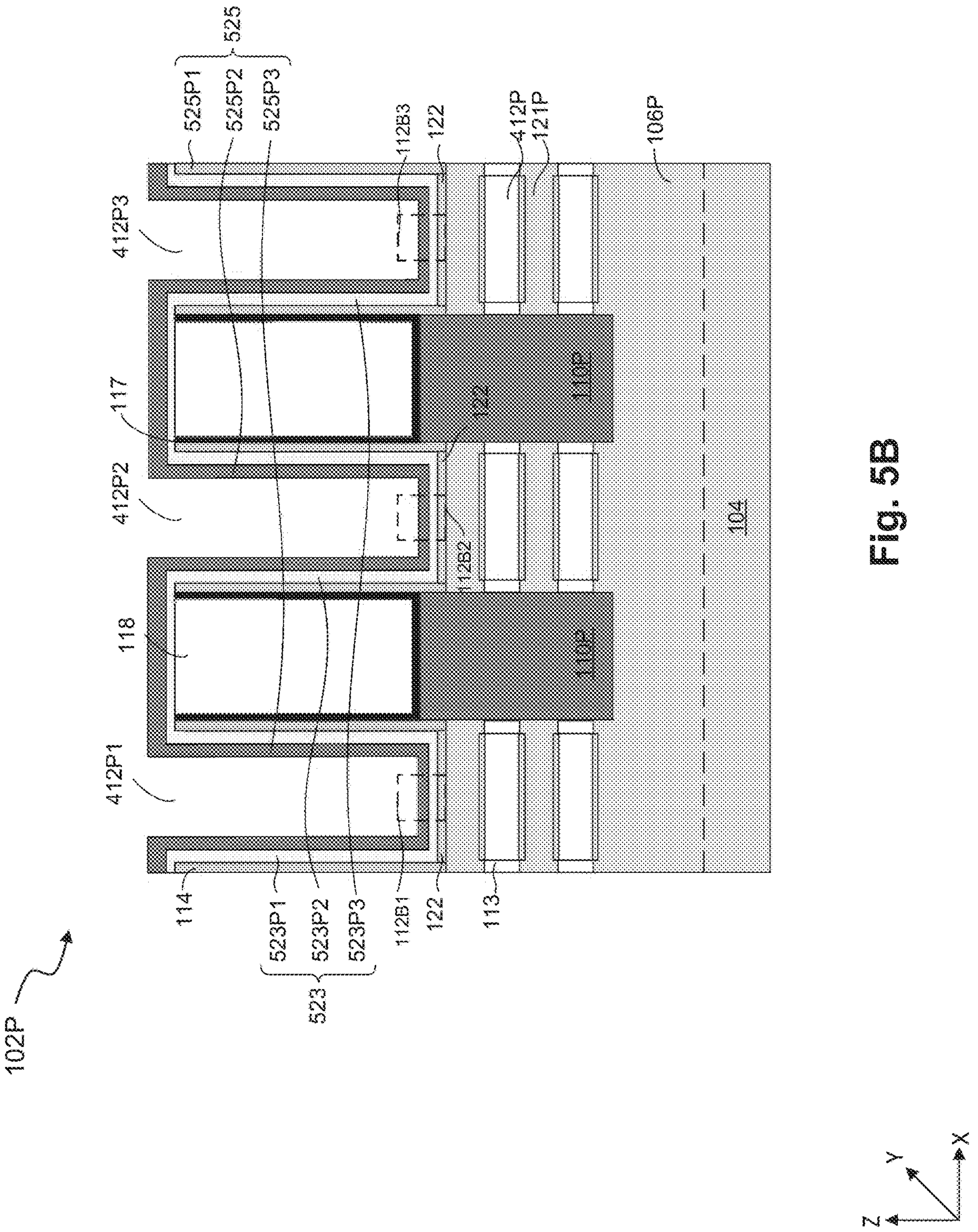

The subsequent processing on the structures of FIGS. 5A and 5B in operations 235-245 are described with reference to FIGS. 6A-20B. FIGS. 6A-20A are enlarged views of gate regions 112A1-112A3 of FIG. 5A, and FIGS. 5B-20B are enlarged views of gate regions 112B1-112B3 of FIG. 5B.

Referring to FIG. 2, in operation 235, a doping process is performed on the first HK gate dielectric layer and the diffusion barrier layer. For example, as described with reference to FIGS. 6A-19B, a doping process is performed to dope barrier portions 523N1-523N3 and HK portions 525N1-525N3 in gate openings 412N1-412N3 and to dope barrier portions 523P1-523P3 and HK portions 525P1-525P3 in gate openings 412P1-412P3 at the same time. Barrier portions 523N1-523N3 and HK portions 525N1-525N3 are doped with a first type metal dopants that induce N-dipoles of dipole layers 140N1-140N3. Barrier portions 523P1-523P3 and HK portions 525P1-525P3 are doped with a second type metal dopants that induce P-dipoles of dipole layers 140P1-140P3 at the same time. The first and second type metal dopants are different from each other.

Figure 6A:
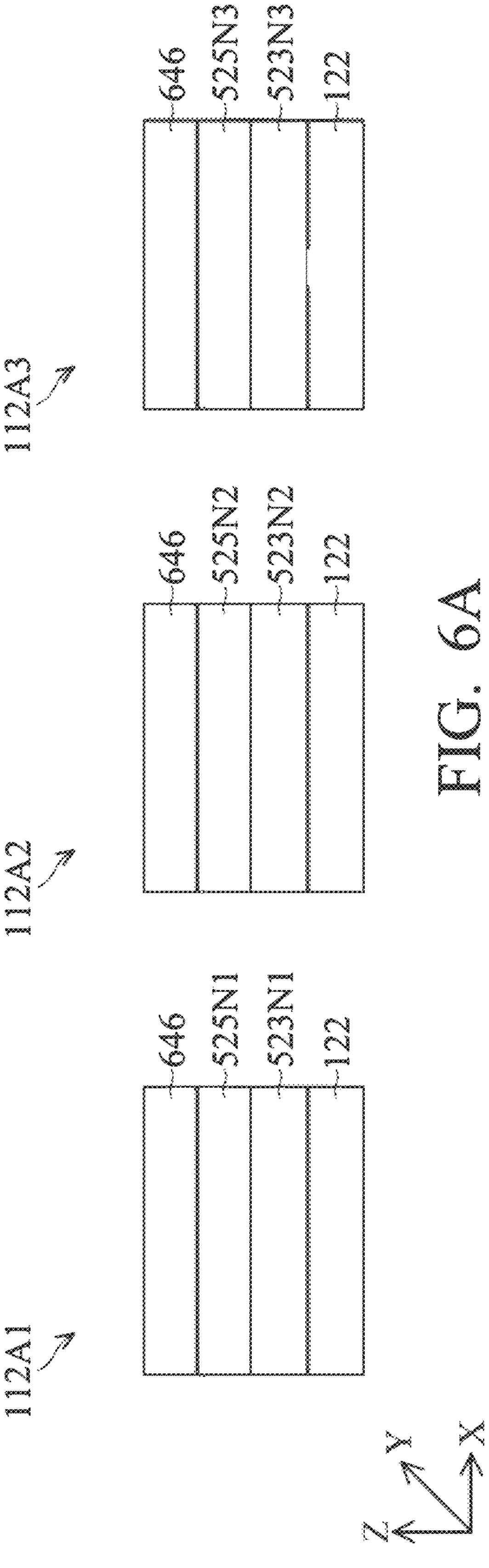
Figure 6B:
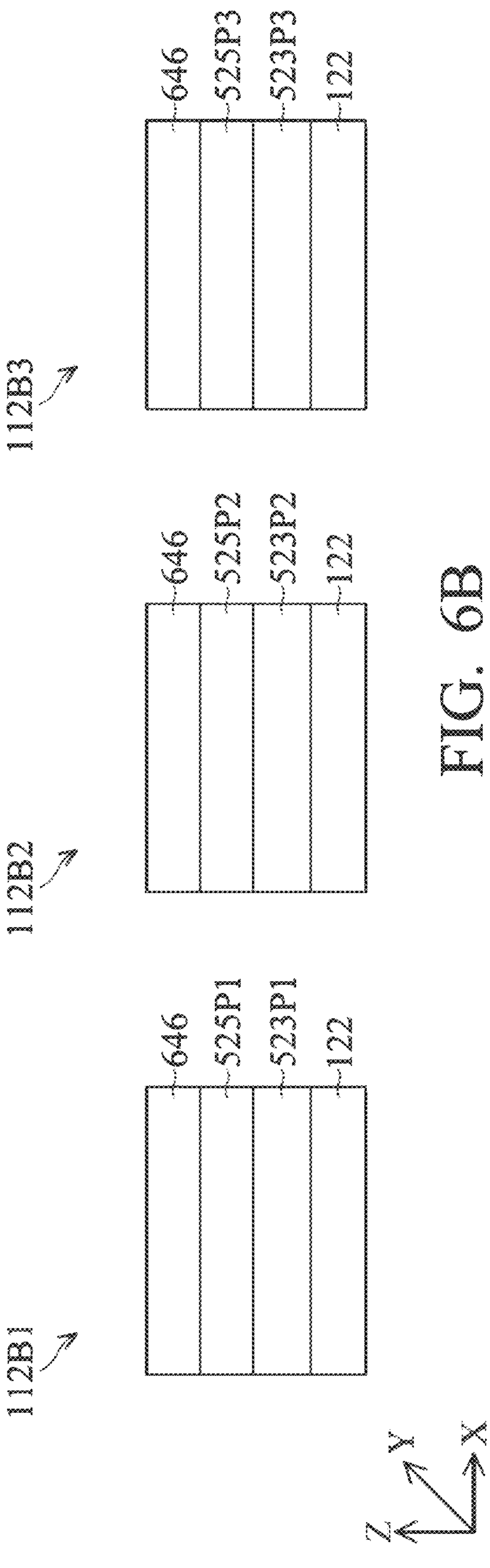
Figure 7A:
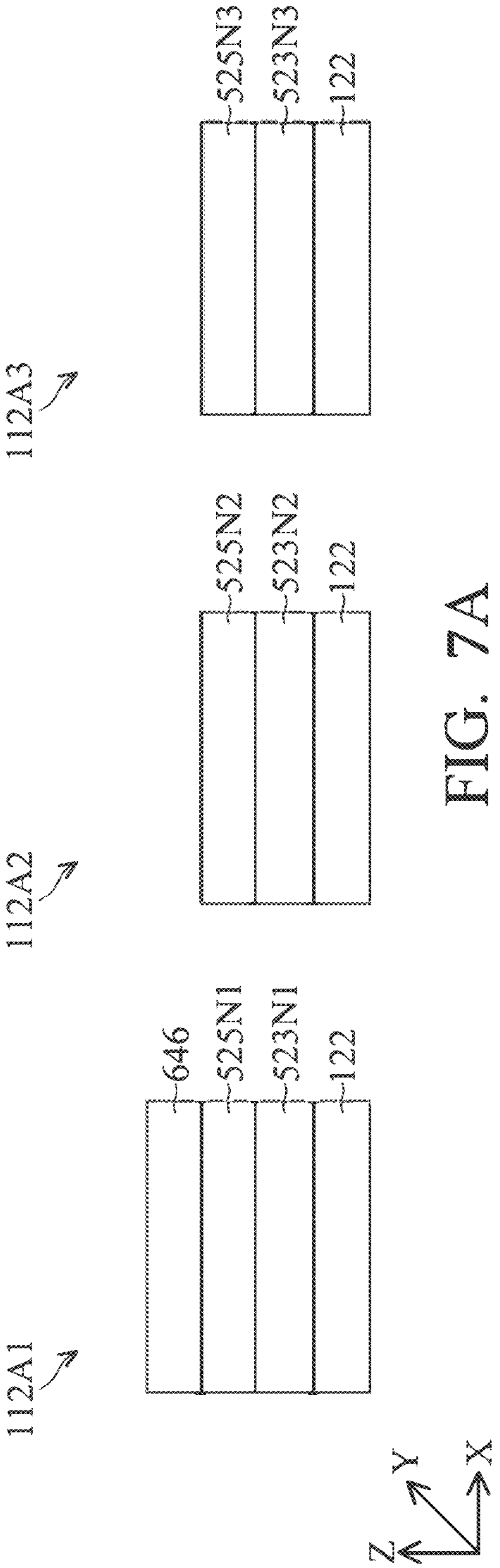
Figure 7B:
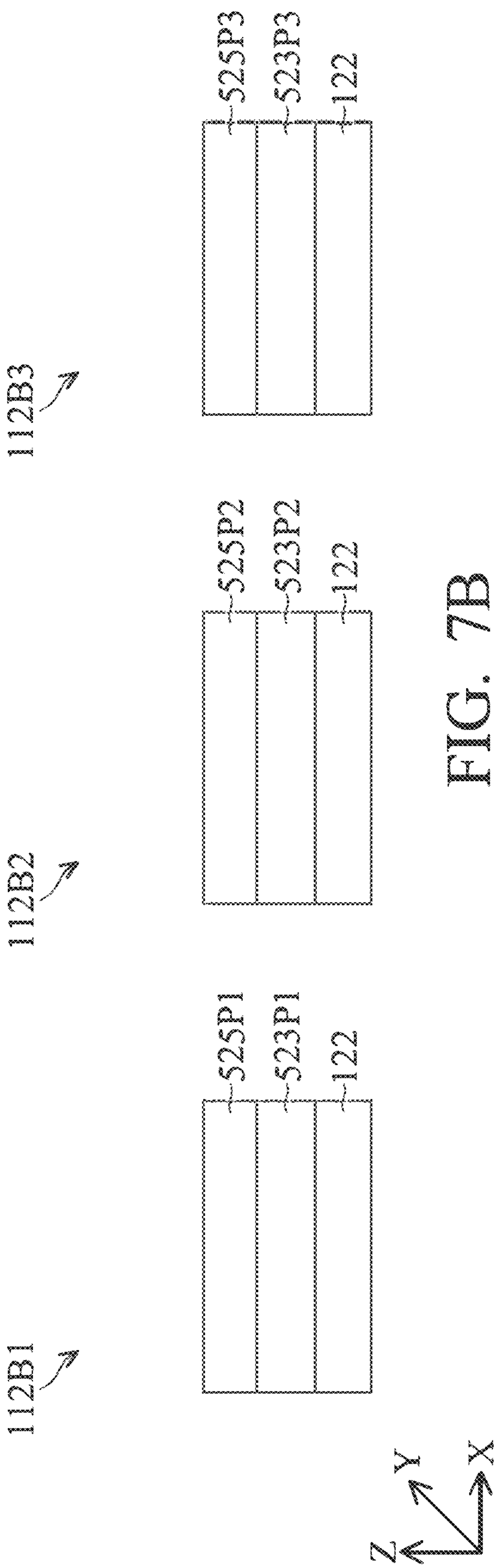
Figure 8A:
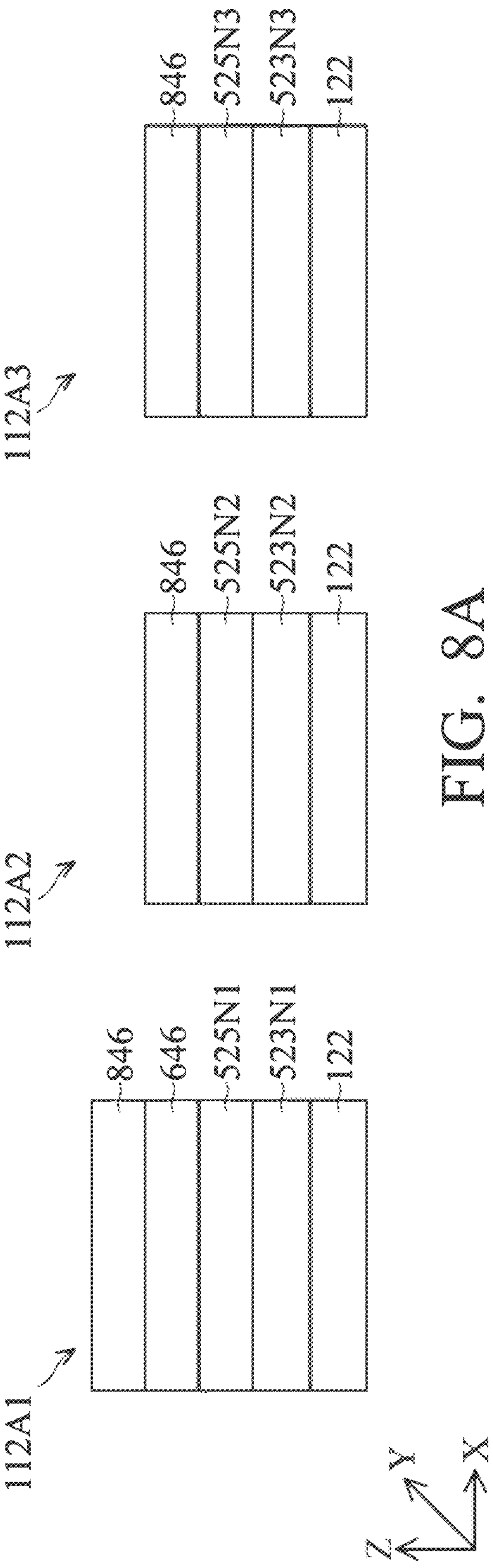
Figure 8B:
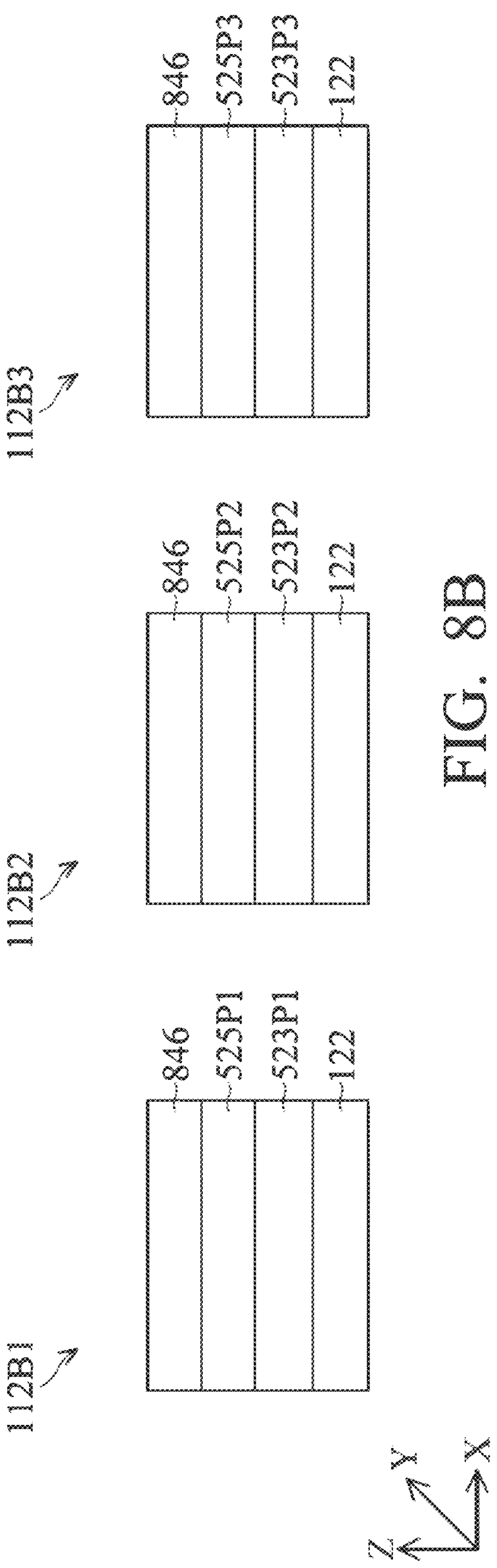
Figure 9A:
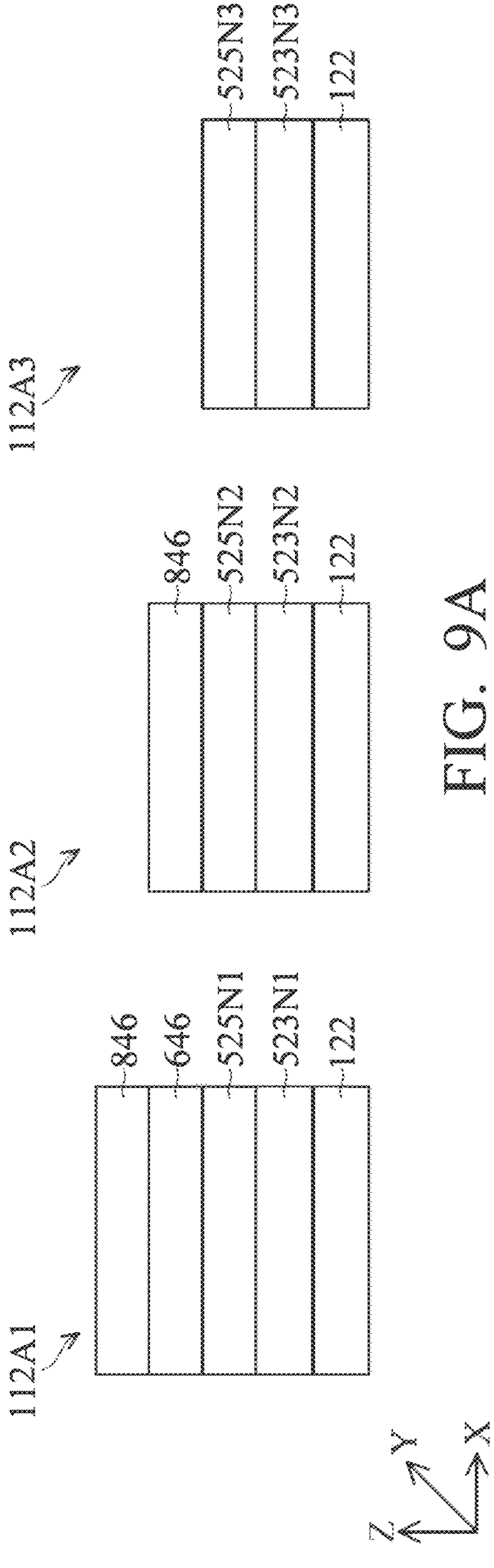
Figure 9B:
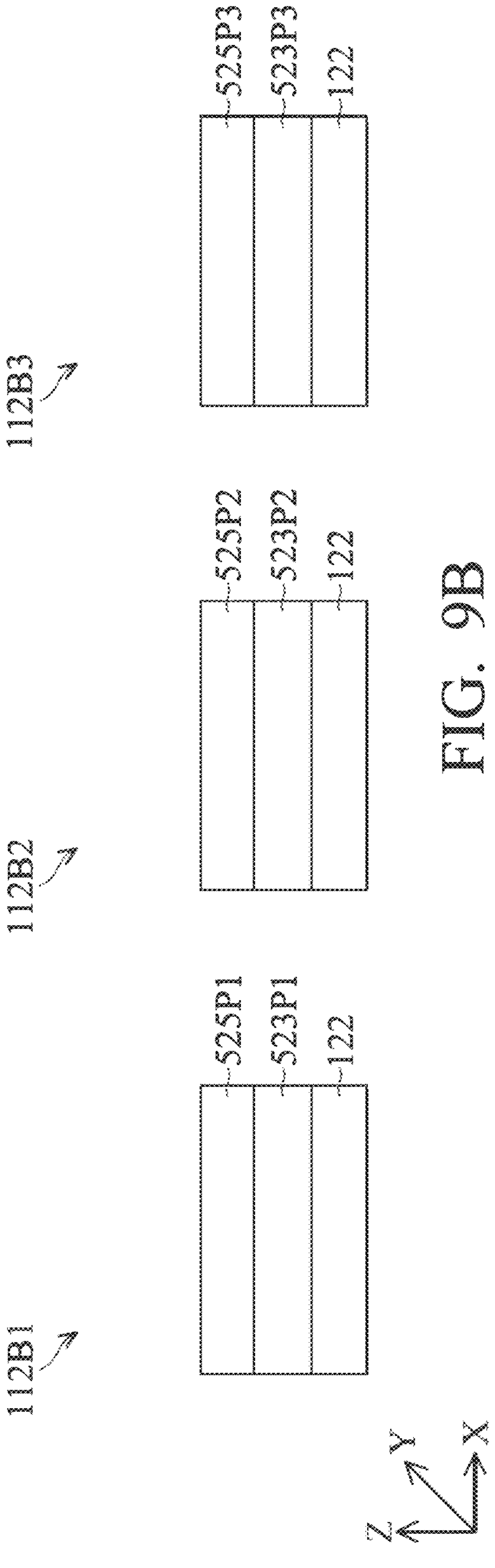
Figure 10A:
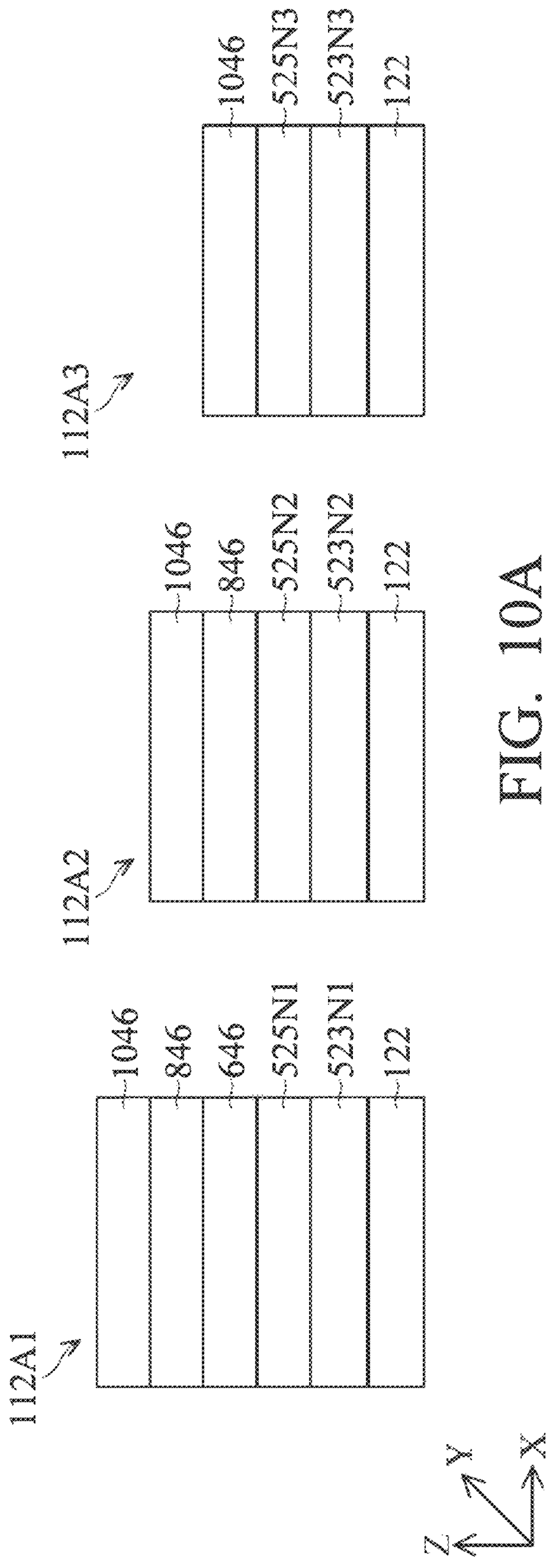
Figure 10B:
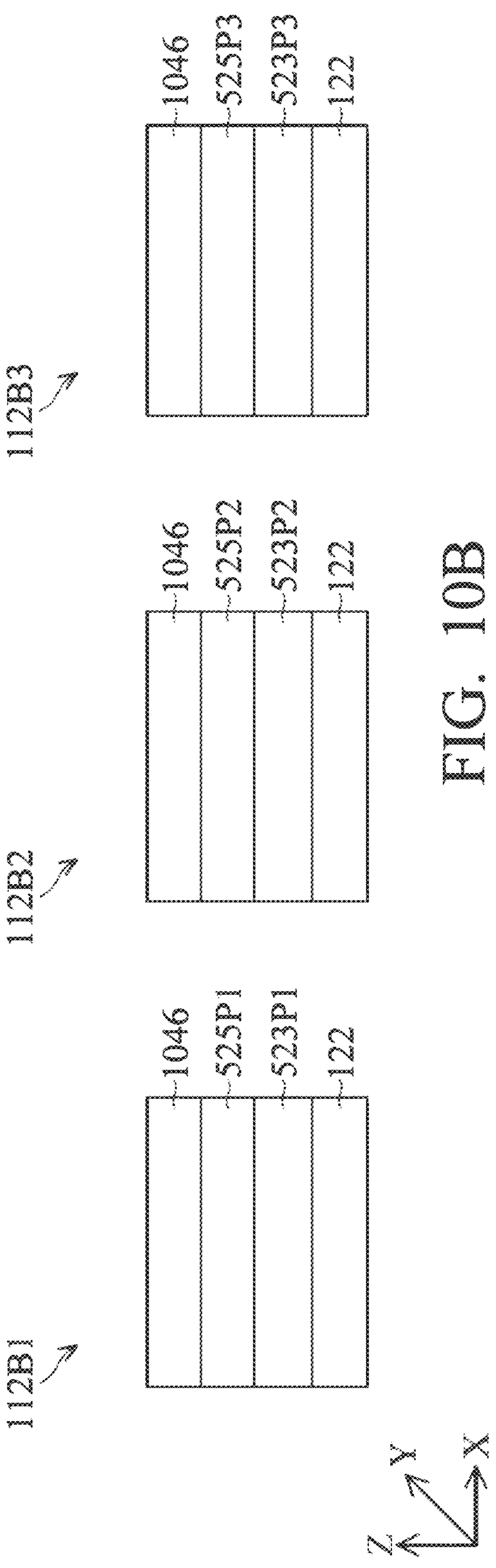
Figure 11A:
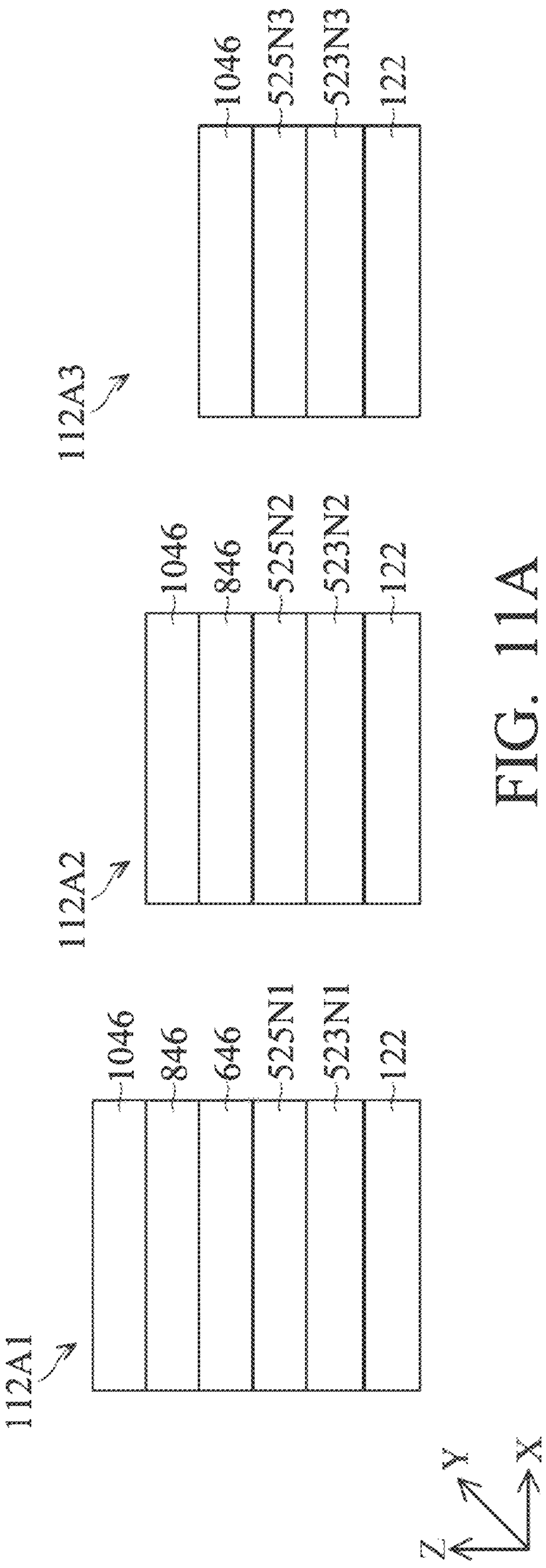
Figure 11B:
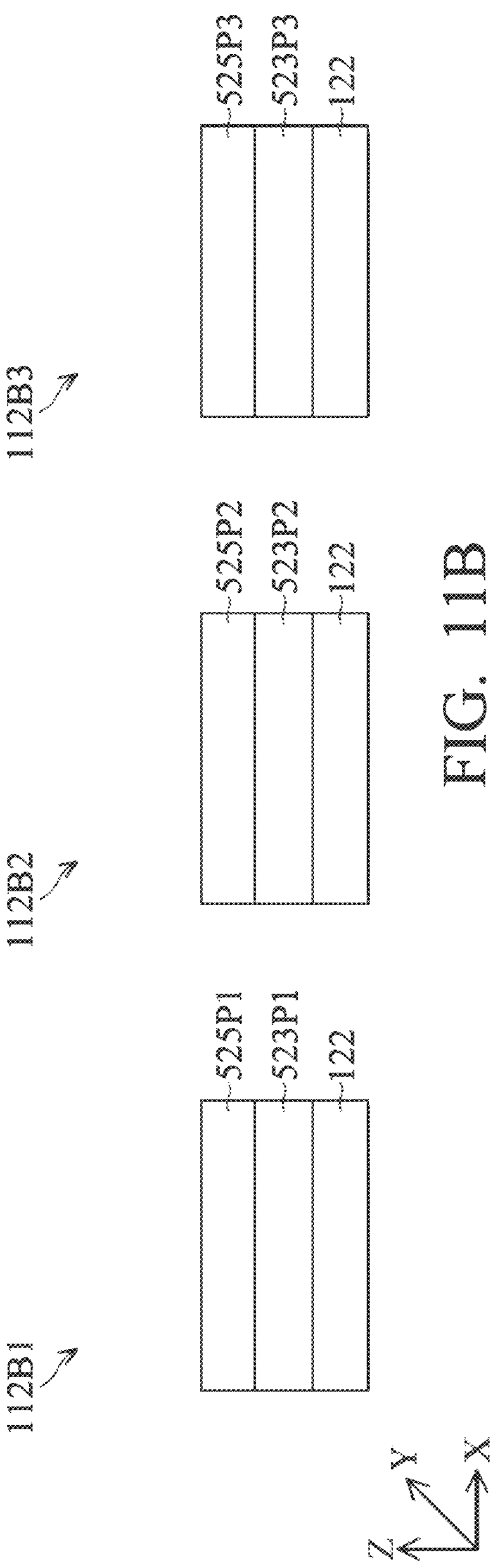
Figure 12A:
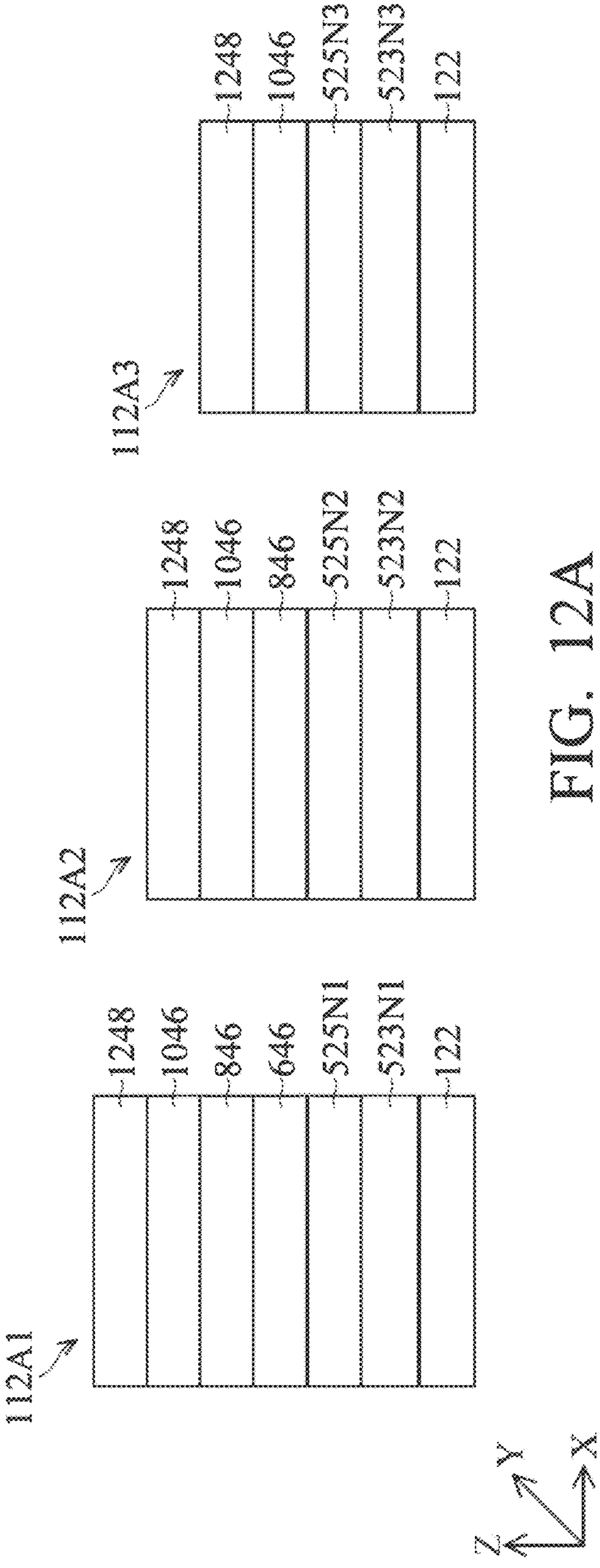
Figure 12B:
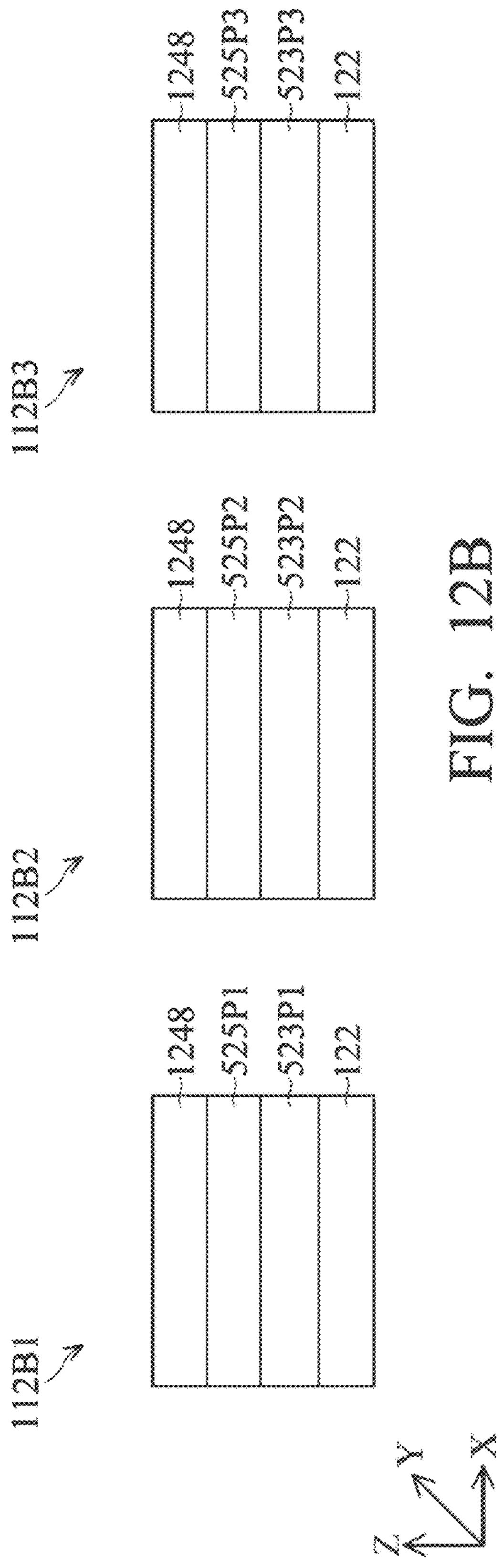
Figure 13A:
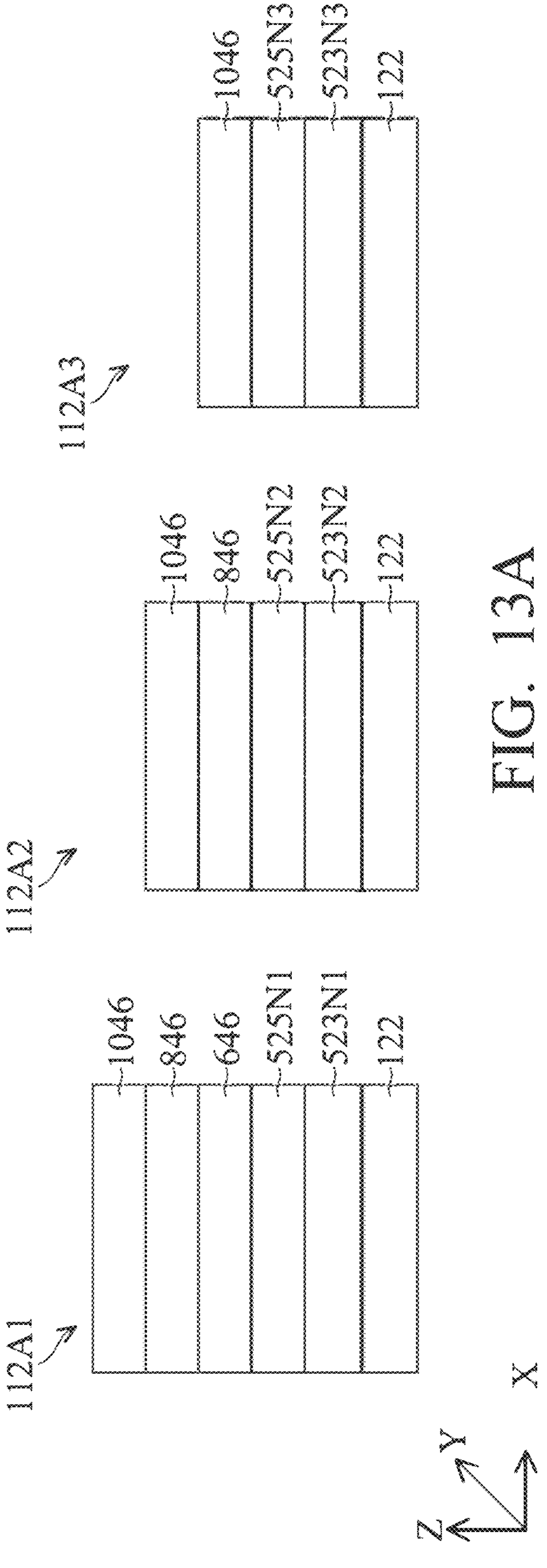
Figure 13B:
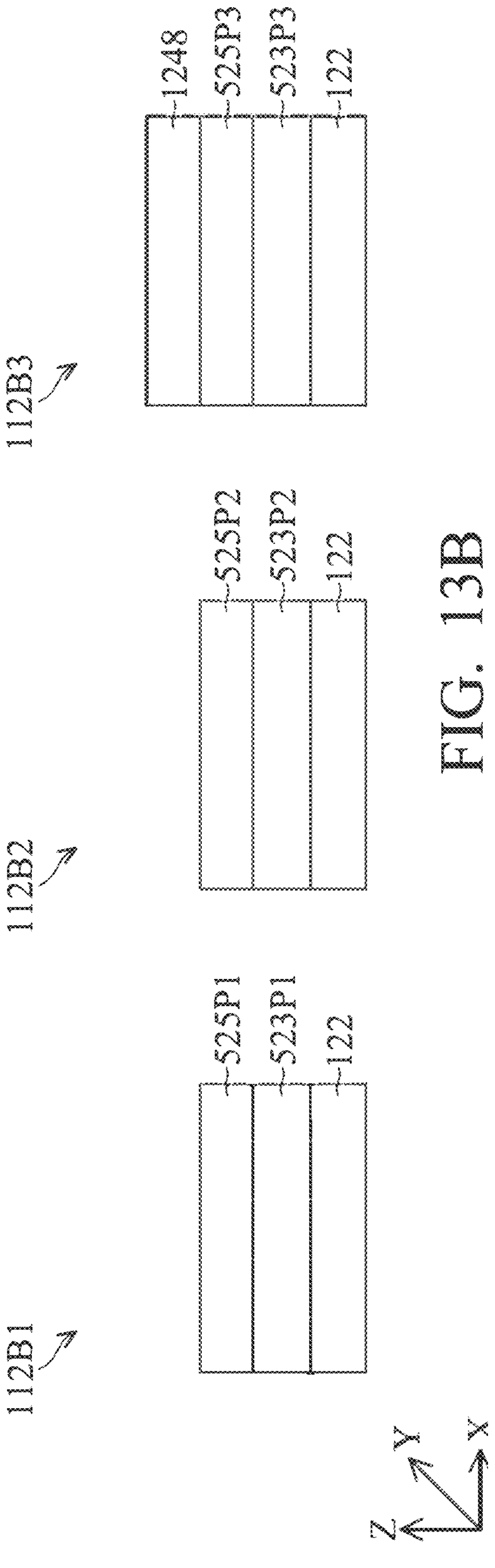
Figure 14A:
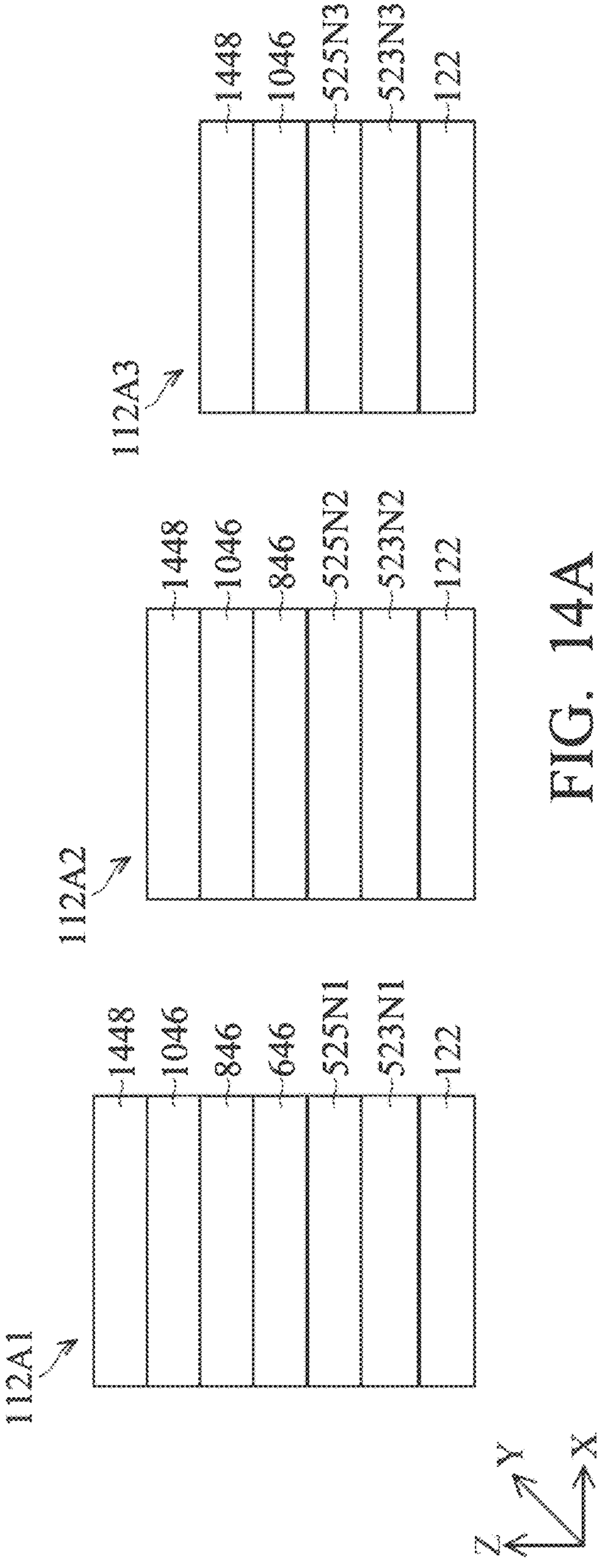
Figure 14B:
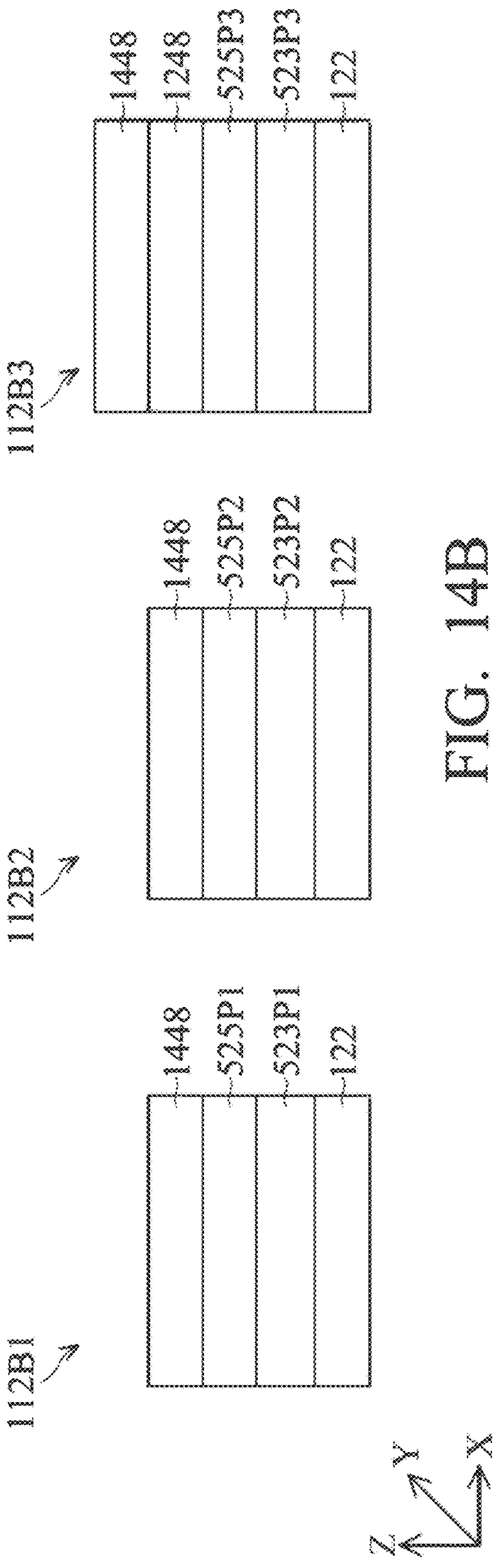
Figure 15A:
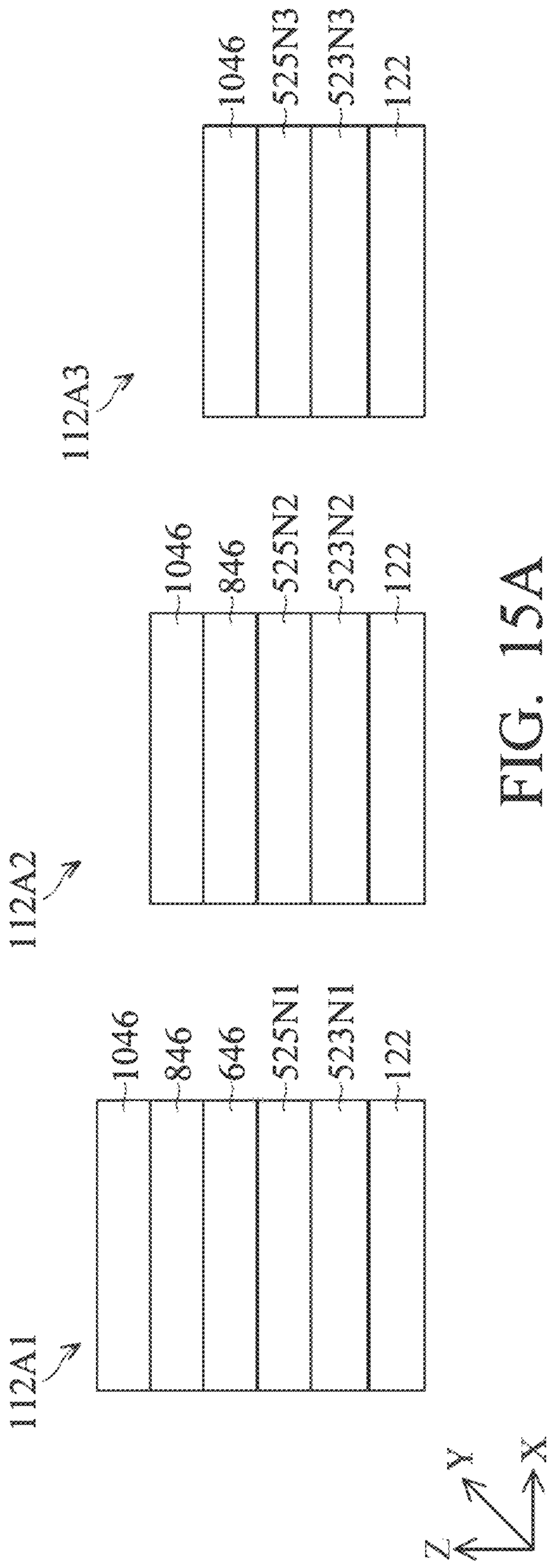
Figure 15B:
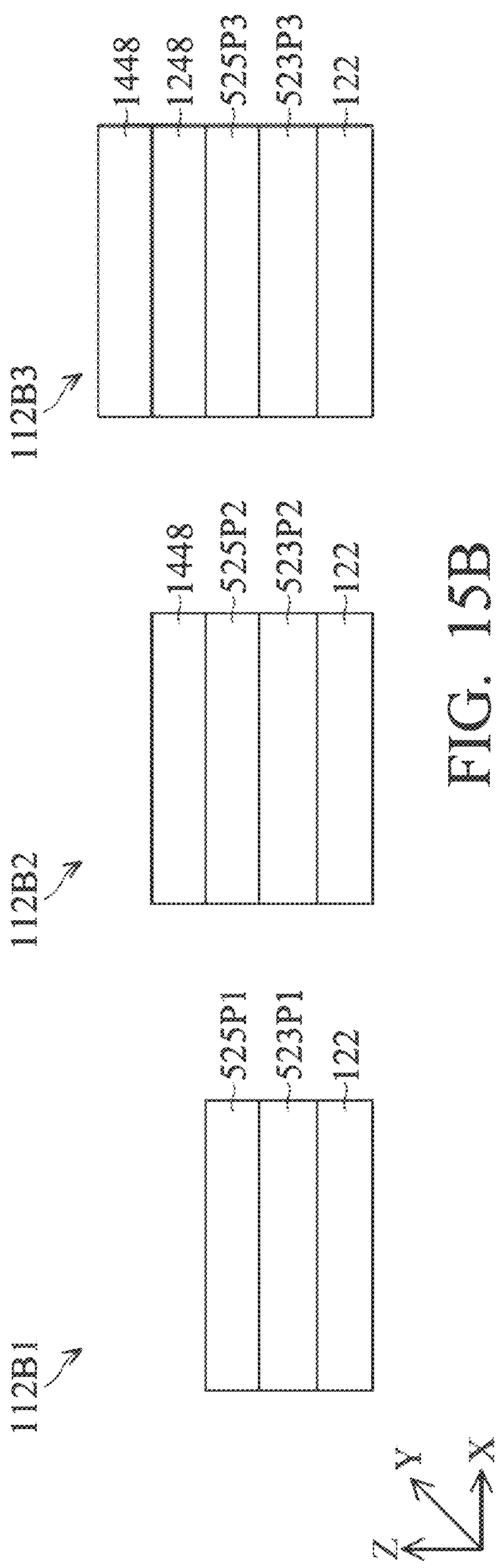
Figure 16A:
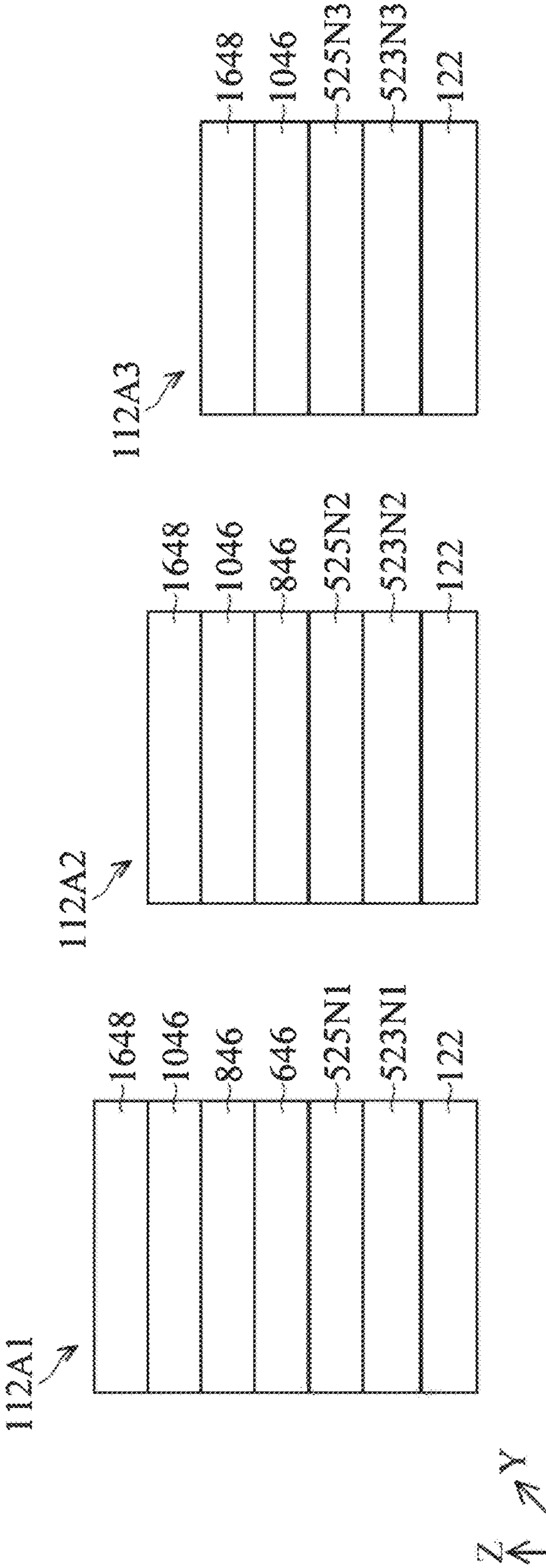
Figure 16B:
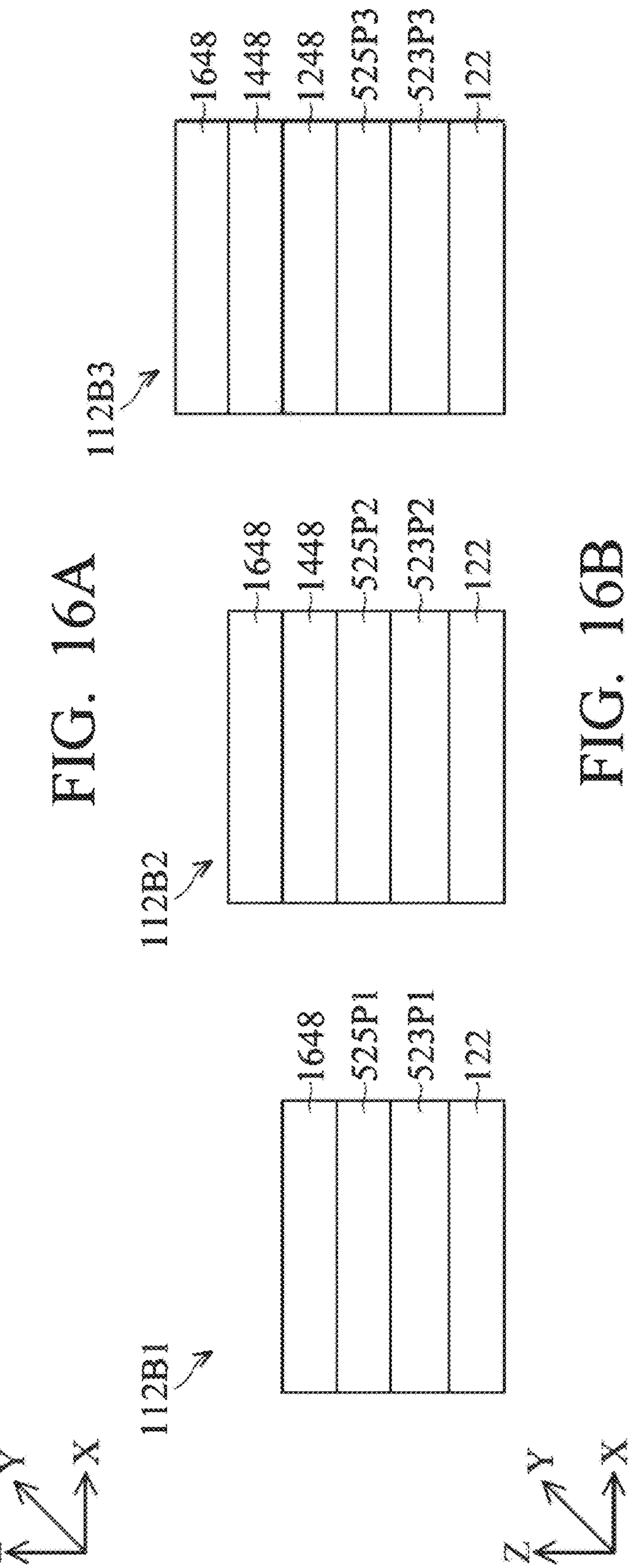
Figure 17A:
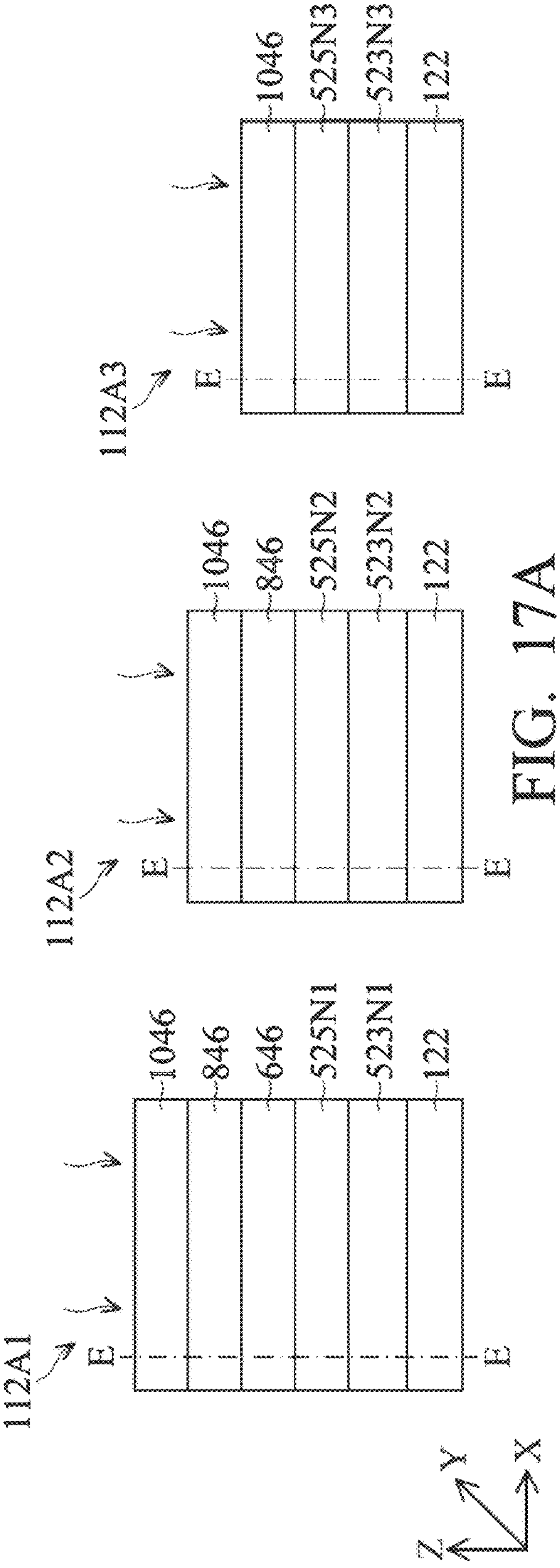
Figure 17B:
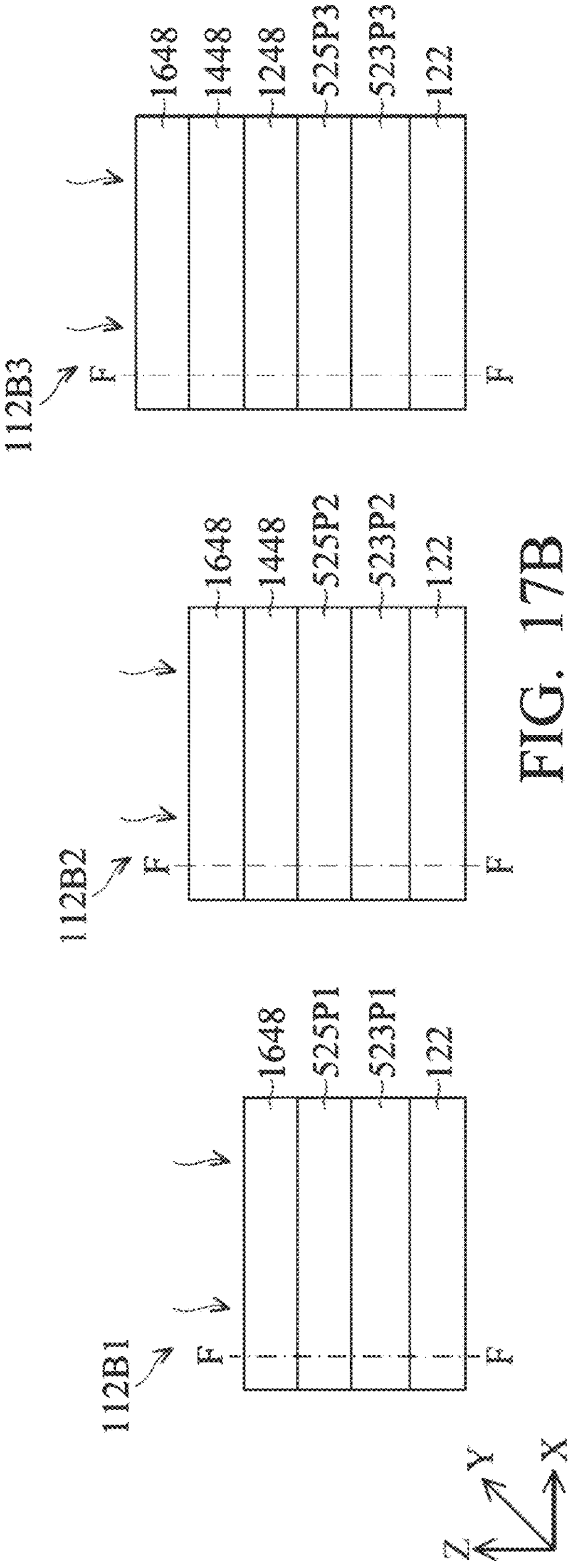
Figures 18A, 18B:
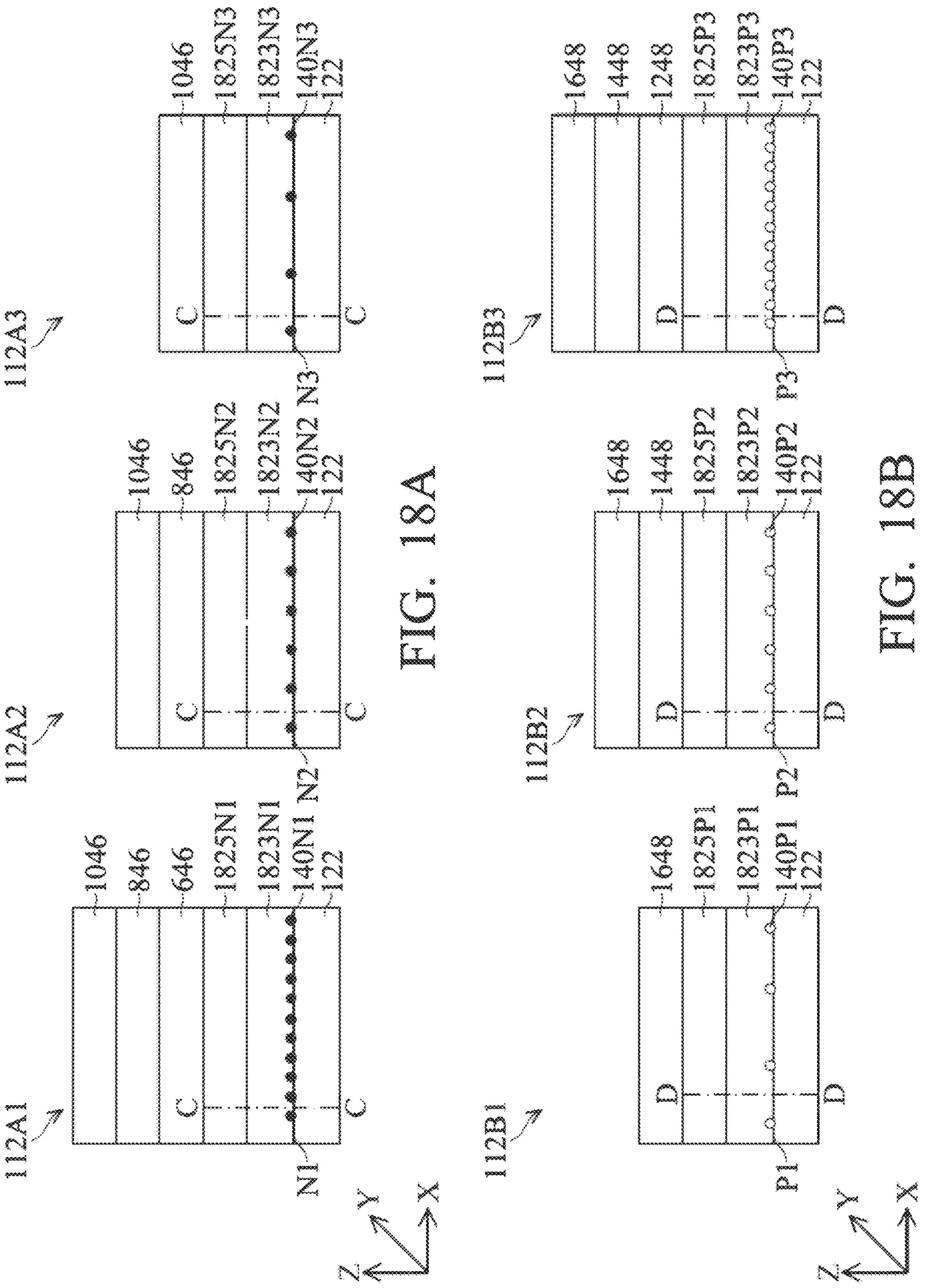
Figure 19A:
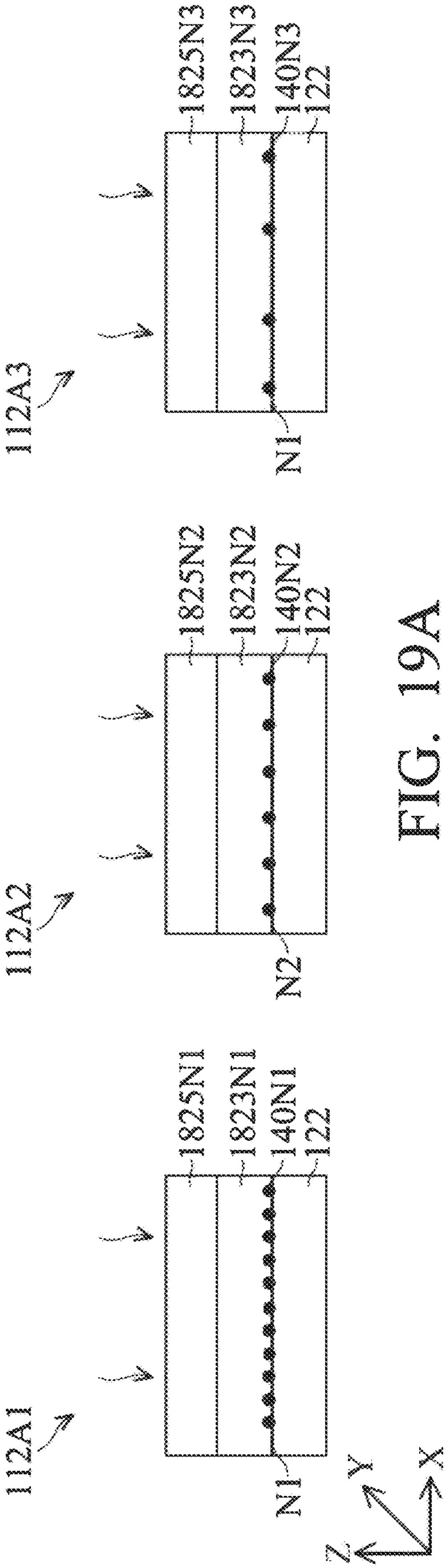
Figure 19B:
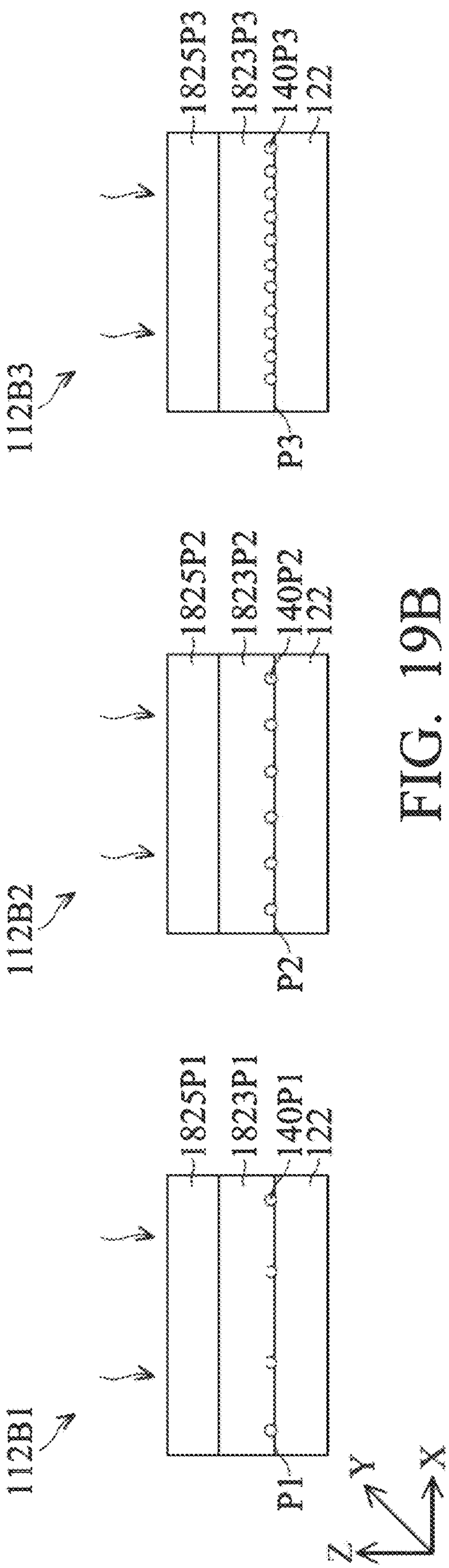
Figure 20A:
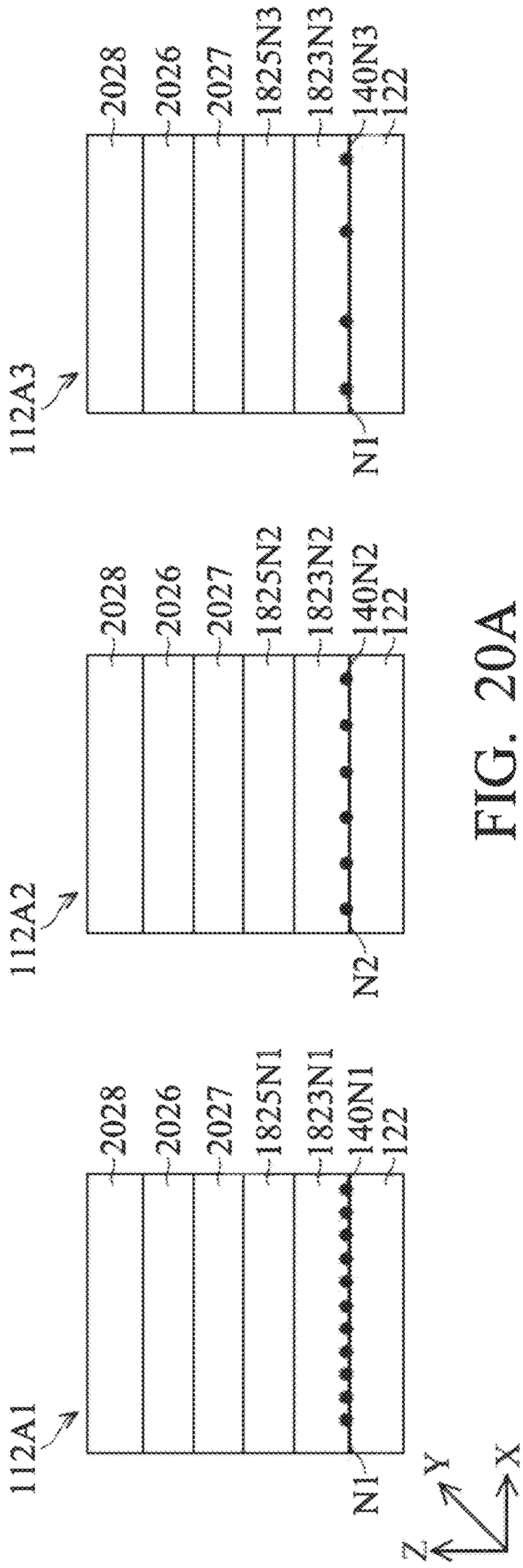
Figure 20B:
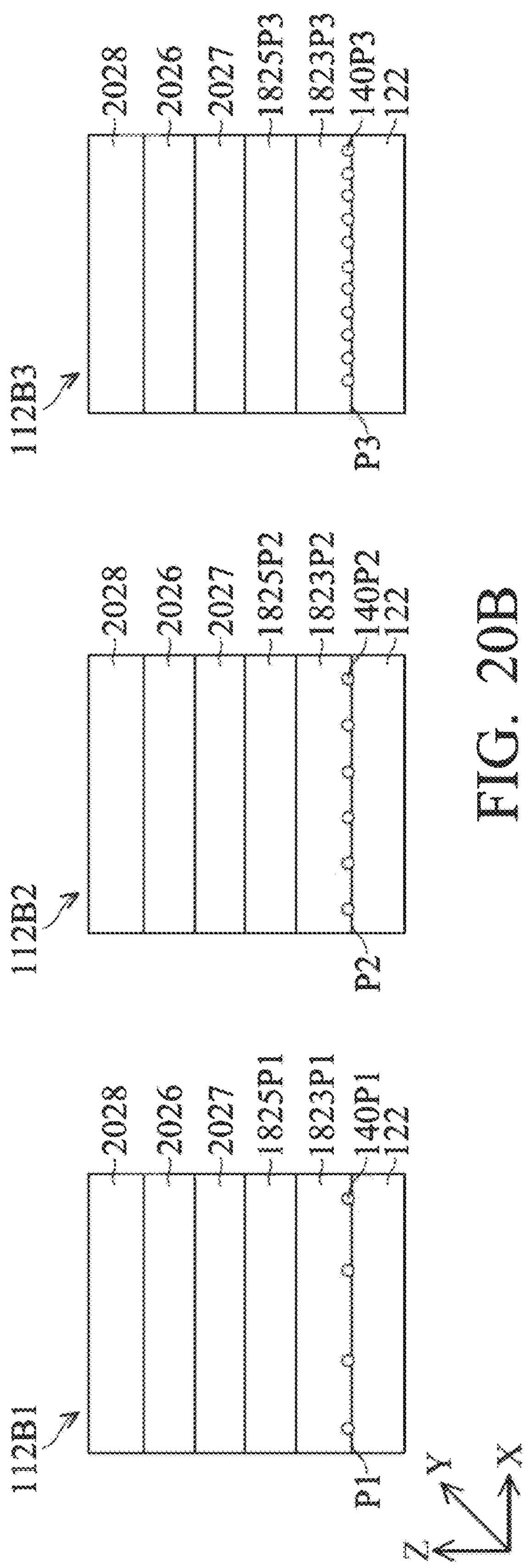

The doping process can include sequential operations of (i) depositing a dopant source layer 646 on HK portions 525N1-525N3 and 525P1-525P3, as shown in FIGS. 6A and 6B, (ii) selectively removing portions of dopant source layer 646 on HK portions 525N2-525N3 and 525P1-525P3 using lithographic patterning and etching processes to form the structures of FIGS. 7A and 7B, (iii) depositing a dopant source layer 846 on dopant source layer 646 and HK portions 525N2-525N3 and 525P1-525P3, as shown in FIGS. 8A and 8B, (iv) selectively removing portions of dopant source layer 846 on HK portions 525N3 and 525P1-525P3 using lithographic patterning and etching processes to form the structures of FIGS. 9A and 9B, (v) depositing a dopant source layer 1046 on dopant source layer 846 and HK portions 525N3 and 525P1-525P3, as shown in FIGS. 10A and 10B, (vi) selectively removing portions of dopant source layer 1046 on HK portions 525P1-525P3 using lithographic patterning and etching processes to form the structures of FIGS. 11A and 11B, (vii) depositing a dopant source layer 1248 on dopant source layer 1046 and HK portions 525P1-525P3, as shown in FIGS. 12A and 12B, (viii) selectively removing portions of dopant source layer 1248 on HK portions 525P1-525P2 and dopant source layer 1046 using lithographic patterning and etching processes to form the structures of FIGS. 13A and 13B, (ix) depositing a dopant source layer 1448 on dopant source layers 1046 and 1248 and HK portions 525P1-525P2, as shown in FIGS. 14A and 14B, (x) selectively removing portions of dopant source layer 1448 on HK portions 525P1 and dopant source layer 1046 using lithographic patterning and etching processes to form the structures of FIGS. 15A and 15B, (xi) depositing a dopant source layer 1648 on dopant source layers 1046 and 1448 and HK portion 525P1, as shown in FIGS. 16A and 16B, (xii) selectively removing portions of dopant source layer 1648 on dopant source layer 1046 using lithographic patterning and etching processes to form the structures of FIGS. 17A and 17B, (xiii) performing a drive-in anneal process on the structures of FIGS. 17A and 17B to form doped barrier portions 1823N1-1823N3 and 1823P1-1823P2 and doped HK portions 1825N1-1825N3 and 1825P1-1825P3, as shown in FIGS. 18A and 18B (xiv) removing dopant source layers 646, 846, 1046, 1248, 1448, and 1648 from the structures of FIGS. 18A and 18B to form the structures of FIGS. 19A and 19B, and (xv) performing an anneal process on the structures of FIGS. 19A and 19B.

Though FIGS. 6A-19B show forming the dopant source layers of NFET 102N prior to forming the dopant source layers of PFET 102P, the formation of dopant source layers of NFET 102N and PFET 102P can be performed in any order. In some embodiments, dopant source layers 1248, 1448, and 1648 can be formed on HK portions 525P1-525P3 prior to forming dopant source layers 646, 846, and 1046 on HK portions 525N1-525N3.

The deposition of each dopant source layers 646, 846, and 1046 can include depositing an REM oxide, such as $La_2O_3$, $Y_2O_3$, cerium oxide ($CeO_2$), ytterbium oxide ($Yb_2O_3$), and erbium oxide ($Er_2O_3$) in a CVD process or an ALD process. In some embodiments, each dopant source layers 646, 846, and 1046 is formed by depositing a layer of REM oxide that is different from the metal oxide of diffusion barrier layer 523. In some embodiments, the deposition of each dopant source layers 646, 846, and 1046 can include depositing a layer of $La_2O_3$ when diffusion barrier layer 523 is formed by depositing a layer of $Al_2O_3$. In some embodiments, depositing the REM oxide for each dopant source layers 646, 846, and 1046 can include depositing the REM oxide with a thickness of about 1 nm to about 3 nm to adequately dope barrier portions 523N1-523N3 and HK portions 525N1-525N3 without compromising device manufacturing cost. In some embodiments, dopant source layers 646, 846, and 1046 can have the same REM oxide.

The deposition of each dopant source layers 1248, 1448, and 1648 can include depositing a metal oxide, such as zinc oxide (ZnO), $GeO_2$, $Al_2O_3$, titanium oxide ($TiO_2$), and vanadium oxide ($V_2O_3$) in a CVD process or an ALD process. In some embodiments, each dopant source layers 1248, 1448, and 1648 is formed by depositing a layer of metal oxide that is different from the metal oxide of diffusion barrier layer 523. In some embodiments, depositing the metal oxide for each dopant source layers 1248, 1448, and 1648 can include depositing the metal oxide with a thickness of about 1 nm to about 3 nm to adequately dope barrier portions 523P1-523P3 and HK portions 525P1-525P3 without compromising device manufacturing cost. In some embodiments, dopant source layers 1248, 1448, and 1648 can have the same metal oxide.

Different number of dopant source layers are deposited on HK portions 525N1-525N3 for doping barrier portions 523N1-523N3 and HK portions 525N1-525N3 with different concentrations of the first type metal dopants to induce different concentrations of N-dipoles in dipole layers 140N1-140N3. For example, the stack of three dopant source layers 646, 846, and 1046 can implant a higher concentration of the first type metal dopants into barrier portion 523N1 and HK portion 525N1 than that implanted from the stack of two dopant source layers 646 and 846 into barrier portion 523N2 and HK portion 525N2, and from one dopant source layer 646 into barrier portion 523N3 and HK portion 525N3. Similarly, different number of dopant source layers are deposited on HK portions 525P1-525P3 for doping barrier portions 523P1-523P3 and HK portions 525P1-525P3 with different concentrations of the second type metal dopants to induce different concentrations of P-dipoles in dipole layers 140P1-140P3. For example, the stack of three dopant source layers 1248, 1448, and 1648 can implant a higher concentration of the second type metal dopants into barrier portion 523P3 and HK portion 525P3 than that implanted from the stack of two dopant source layers 1448 and 1648 into barrier portion 523P2 and HK portion 525P2 and from one dopant source layer 1648 into barrier portion 523P1 and HK portion 525P1.

The drive-in anneal process can diffuse (i) metal atoms from dopant source layers 646, 846, and 1046 into barrier portion 523N1 and HK portion 525N1 to form doped barrier portion 1823N1 and HK portion 1825N1, (ii) metal atoms from dopant source layers 846 and 1046 into barrier portion 523N2 and HK portion 525N2 to form doped barrier portion 1823N2 and HK portion 1825N2, and (iii) metal atoms from dopant source layers 1046 into barrier portion 523N3 and HK portion 525N3 to form doped barrier portion 1823N3 and HK portion 1825N3. At the same time, the drive-in anneal process can diffuse (i) metal atoms from dopant source layers 1248, 1448, and 1648 into barrier portion 523P3 and HK portion 525P3 to form doped barrier portion 1823P3 and HK portion 1825P3, (ii) metal atoms from dopant source layers 1448 and 1648 into barrier portion 523P2 and HK portion 525P2 to form doped barrier portion 1823P2 and HK portion 1825P2, and (iii) metal atoms from dopant source layers 1648 into barrier portion 523P1 and HK portion 525P1 to form doped barrier portion 1823P1 and HK portion 1825P1.

Figure 21:
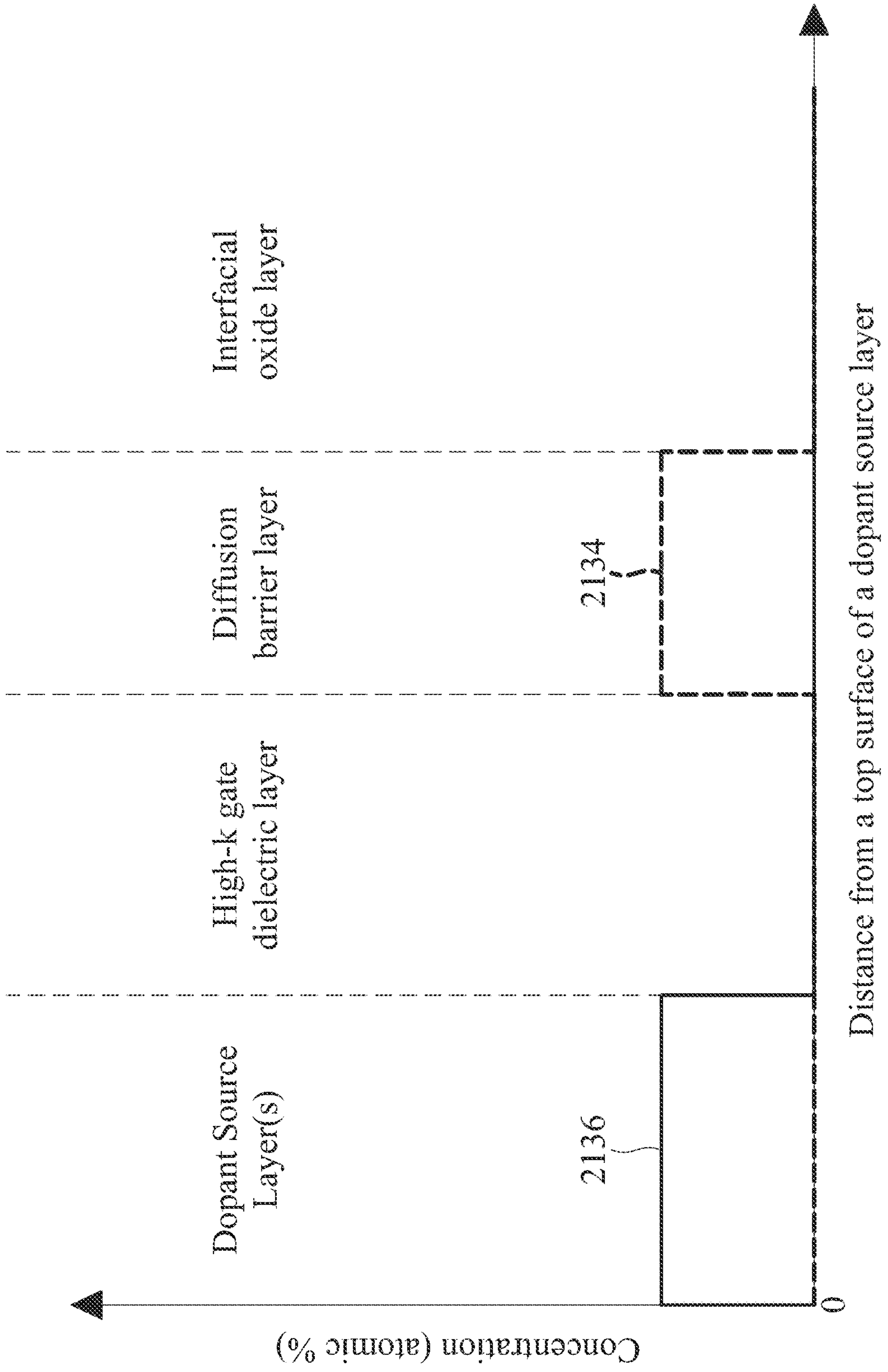
FIG. 21 illustrates device characteristics of a semiconductor device with different gate structures at a stage of its fabrication process, in accordance with some embodiments.

The drive-in anneal process can include annealing the structures of FIGS. 17A and 17B at a temperature of about 500° C. to about 700° C. for a time period of about 10 seconds to about 30 seconds in an ambient of nitrogen. Prior to the drive-in anneal process, the metal atoms of dopant source layers 646, 846, 1046, 1248, 1448, and 1648 can have a concentration profile 2136 across lines E-E of FIG. 17A and lines F-F of FIG. 17B, as shown in FIG. 21. After the drive-in anneal process, the metal dopants in barrier portions 1823N1-1823N3 and 1823P1-1823P2 and doped HK portions 1825N1-1825N3 and 1825P1-1825P3 can have concentration profile 136, as shown in FIG. 1F, across lines C-C of FIG. 18A and lines D-D of FIG. 18B. In some embodiments, the anneal process performed after the removal of dopant source layers 646, 846, 1046, 1248, 1448, and 1648 can be similar to the drive-in anneal process.

Prior to the drive-in anneal process, the metal atoms of diffusion barrier layer 523 can have a concentration profile 2134, as shown in FIG. 21, across lines E-E of FIG. 17A and lines F-F of FIG. 17B. In some embodiments, the drive-in anneal process can cause some of the metal atoms of the metal oxide of diffusion barrier layer 523 to diffuse into HK portions 525N1-525N3 and 525P1-525P3 and IL layers 122. As a result, metal concentration profile 2134 (shown in FIG. 21) across HK portions 525N1-525N3 and 525P1-525P3, barrier portions 523N1-525N3 and 523P1-523P3, and IL layers 122 can transform into metal concentration profile 134, as shown in FIG. 1F, after the drive-in anneal process.

Referring to FIG. 2, in operation 240, a second HK gate dielectric layer is deposited in the gate openings of the NFET and the PFET. For example, as described with reference to FIGS. 20A and 20B, a second HK gate dielectric layer 2027 is deposited on HK portions 525N1-525N3 and 525P1-525P3 in gate openings 412N1-412N3 and 412P1-412P3. The deposition of second HK gate dielectric layer 2027 can include depositing a layer of high-k dielectric material, such as $HfO_2$, $TiO_2$, HfZrO, $Ta_2O_3$, $HfSiO_4$, $ZrO_2$, and $ZrSiO_2$ with a thickness of about 0.5 nm to about 1 nm. In subsequent processing, second HK gate dielectric layer 2027 form undoped HK gate dielectric layers 127N1-127N3 and 127P1-127P3.

Referring to FIG. 2, in operation 245, a WFM layer is deposited on the second HK gate dielectric layer and a gate metal fill layer is deposited on the WFM layer. For example, as described with reference to FIGS. 20A and 20B, a WFM layer 2026 is deposited on second HK gate dielectric layer 2027 and a gate metal fill layer 2228 is deposited on WFM layer 2026. In some embodiments, the deposition of WFM 2026 can include depositing a pWFM layer or an nWFM layer on second HK gate dielectric layer 2027. In some embodiments, the deposition of WFM 2026 can include selectively forming an nWFM layer on portions of second HK gate dielectric layer 2027 of NFET 102N and or selectively forming a pWFM layer on portions of second HK gate dielectric layer 2027 of PFET 102P. The deposition of gate metal fill layer 2228 can be followed by a chemical mechanical polishing (CMP) process and an etching process on gate structures 112N1-112N3 and 112P1-112P3 to form diffusion barrier layers 123N-123N3 and 123P1-123P2, HK gate dielectric layers 124N1-124N2 and 124P1-124P2, WFM layers 126, and gate metal fill layers 128, as shown in FIGS. 1B-1E. The etching process can be followed by the formation of conductive capping layers 130 and insulating capping layers 132.

The present disclosure provides example methods of forming GAA FETs (e.g., GAA FETs 102N and 102P) with improved thickness profile control of the IL layers (e.g., IL layers 122) and with different gate structures (e.g., gate structures 112N1-112N3 and 112P1-112P3) configured to provide different threshold voltages on the same substrate (e.g., substrate 104). The example methods form NFETs and PFETs (e.g., NFET 102N and PFET 102P) with scaled down IL layers (e.g., IL layers 122) of about 0.4 nm to about 0.8 nm for reduced capacitance effective thickness (CET), thus increasing FET drive currents. In addition, the example methods form NFETs and PFETs with WFM layers (e.g., WFM layers 126) of substantially equal thicknesses, and with extreme-low, ultra-low, and/or low threshold voltages, on the same substrate. These example methods can be more cost-effective (e.g., reduce cost by about 20% to about 30%) and time-efficient (e.g., reduce time by about 15% to about 20%) in manufacturing reliable GAA FET gate structures with different threshold voltages than other methods of forming GAA FETs with similar dimensions and threshold voltages on the same substrate. In addition, these example methods can form GAA FET gate structures with much smaller dimensions (e.g., thinner gate stacks) than other methods of forming GAA FETs with similar threshold voltages.

In some embodiments, the gate structures of the NFETs and PFETs can include diffusion barrier layers (e.g., diffusion barrier layers 123N1-123N3 and 123P1-123P3) disposed on the IL layers (e.g., IL layers 122). The diffusion barrier layers can prevent or minimize the diffusion of oxygen atoms from overlying layers (e.g., HK gate dielectric layers 124N1-124N3 and 124P1-124P3) to the nanostructured channel regions (e.g., nanostructured channel regions 121N and 121P) during thermal processing of the NFETs and PFETs. Preventing or minimizing the diffusion of the oxygen atoms can prevent or minimize the oxidation of the nanostructured channel regions. Thus, with the use of the diffusion barrier layers, the IL layers can be adequately maintained at a thickness of about 0.4 nm to about 0.8 nm during the different thermal processes performed in the fabrication of the NFETs and PFETs. In some embodiments, for adequate thickness profile control of the IL layers, the diffusion barrier layers can include a metal oxide with a lower Gibbs free energy of formation than that of a metal oxide (e.g., $HfO_2$) of the HK gate dielectric layers. In some embodiments, such a metal oxide of the diffusion barrier layers can include $Al_2O_3$, $La_2O_3$, $Sc_2O_3$, $Y_2O_3$, $Gd_2O_3$, MgO, CaO, or $ZrSiO_4$. In some embodiments, the diffusion barrier layers can have a thickness of about 0.3 nm to about 0.5 nm for adequately preventing or minimizing the diffusion of oxygen atoms without compromising device size and manufacturing cost.

In some embodiments, NFETs and PFETs with different gate structure configurations, but with WFM layers of substantially equal thicknesses, can be formed on the same substrate to achieve different threshold voltages. The different gate structures can have the diffusion barrier layers (e.g., diffusion barrier layers 123N1-123N3 and 123P1-123P3) and the HK gate dielectric layers (e.g., HK gate dielectric layers 125N1-125N3 and 125P1-125P3) doped with metal dopants of different types and/or concentrations. The different types and/or concentrations of metal dopants can induce dipoles of different polarities and/or concentrations at barrier-IL interfaces (e.g., barrier-IL interfaces N1-N3 and P1-P3). The dipoles of different polarities and/or concentrations result in gate structures with different EWF values. Since EWF values of gate structures correspond to threshold voltage of NFETs and PFETs, gate structures with different EWF values result in NFETs and PFETs with different threshold voltages on the same substrate. Thus, controlling the types and/or concentrations of metal dopants in the diffusion barrier layers and the HK gate dielectric layers can tune the EWF values of the NFET and PFET gate structures, and as a result can adjust the threshold voltages of the NFETs and PFETs without varying the WFM layer thicknesses.

In some embodiments, a method includes forming nanostructured channel regions on a fin base, forming gate openings surrounding the nanostructured channel regions, forming oxide layers on exposed surfaces of the nanostructured channel regions and the fin base in the gate openings, depositing a diffusion barrier layer on the oxide layers, depositing a first dielectric layer on the diffusion barrier layer, performing a doping process on the diffusion barrier layer and the first dielectric layer to form a doped diffusion barrier layer and a doped dielectric layer, and depositing a conductive layer on the doped dielectric layer.

In some embodiments, a method includes forming first and second nanostructured channel regions on first and second fin bases, respectively, forming first and second gate openings surrounding the first and second nanostructured channel regions, respectively, performing an oxidation process on exposed surfaces of the first and second nanostructured channel region in the first and second gate openings, respectively, depositing a diffusion barrier layer with first and second barrier portions in the first and second gate openings, respectively, performing a doping process on the first and second barrier portions to form first and second doped barrier portions with first and second metal dopants, respectively, and depositing a conductive layer on the first and second doped barrier portions.

In some embodiments, a semiconductor device includes a substrate, a nanostructured channel region disposed on the substrate, and a gate structure. The gate structure includes an oxide layer surrounding the nanostructured channel region, a doped diffusion barrier layer on the oxide layer, a dipole layer disposed between the oxide layer and the doped diffusion barrier layer, and a doped dielectric layer disposed on the doped diffusion barrier layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming nanostructured channel regions;

forming gate openings surrounding the nanostructured channel regions;

forming oxide layers on exposed surfaces of the nanostructured channel regions in the gate openings;

depositing, on the oxide layers, a diffusion barrier layer comprising a layer of metal oxide;

depositing, on and in contact with the diffusion barrier layer, a first dielectric layer comprising a high-k dielectric material;

performing a doping process on the diffusion barrier layer and the first dielectric layer to form a doped diffusion barrier layer and a doped dielectric layer; and depositing a conductive layer on the doped dielectric layer.

2. The method of claim 1, wherein forming the oxide layers comprises performing a wet oxidation process on the exposed surfaces of the nanostructured channel regions.

3. The method of claim 1, wherein forming the oxide layers comprises oxidizing the exposed surfaces of the nanostructured channel regions in a solution mixture of diluted hydrochloric acid (HCl), hydrogen peroxide ($H_2O_2$), and deionized (DI) water.

4. The method of claim 1, wherein forming the oxide layers comprises performing a wet oxidation process with a solution mixture of diluted hydrochloric acid (HCl), hydrogen peroxide ($H_2O_2$), and deionized (DI) water in a volumetric ratio of about 1:1:50 to about 2:1:100.

5. The method of claim 1, wherein depositing the diffusion barrier layer comprises depositing the layer of metal oxide with a Gibbs free energy of formation lower than that of a metal oxide of the first dielectric layer.

6. The method of claim 1, wherein depositing the diffusion barrier layer comprises depositing the layer of metal oxide with a Gibbs free energy of formation lower than that of hafnium oxide.

7. The method of claim 1, wherein performing the doping process comprises depositing, on the first dielectric layer, a dopant source layer with a metal oxide that is different from a metal oxide of the diffusion barrier layer.

8. The method of claim 1, wherein performing the doping process comprises:
depositing a dopant source layer on the first dielectric layer; and
performing an anneal process on the dopant source layer.

9. The method of claim 1, wherein performing the doping process comprises:
depositing a rare-earth metal-based dopant source layer on the first dielectric layer; and
performing an anneal process on the rare-earth metal-based dopant source layer.

10. The method of claim 1, further comprising depositing a second dielectric layer on the doped dielectric layer prior to depositing the conductive layer.

11. A method, comprising:
forming first and second nanostructured channel regions;
forming first and second gate openings surrounding the first and second nanostructured channel regions, respectively;
performing an oxidation process on exposed surfaces of the first and second nanostructured channel regions in the first and second gate openings, respectively;
depositing a diffusion barrier layer with first and second barrier portions in the first and second gate openings, respectively;
performing a doping process on the first and second barrier portions to form first and second doped barrier portions with first and second metal dopants, respectively, wherein performing the doping process comprises:
depositing, on the first barrier portion, a first dopant source layer with a first metal oxide that is different from a metal oxide of the diffusion barrier layer; and
depositing, on the second barrier portion, a second dopant source layer with a second metal oxide that is different from the first metal oxide and the metal oxide of the diffusion barrier layer; and
depositing a conductive layer on the first and second doped barrier portions.

12. The method of claim 11, wherein performing the oxidation process comprises oxidizing the exposed surfaces of the first and second nanostructured channel regions in a solution mixture of diluted hydrochloric acid (HCl), hydrogen peroxide ($H_2O_2$), and deionized (DI) water.

13. The method of claim 11, wherein performing the oxidation process comprises performing a wet oxidation process with a solution mixture of diluted hydrochloric acid (HCl), hydrogen peroxide ($H_2O_2$), and deionized (DI) water in a volumetric ratio of about 1:1:50 to about 2:1:100.

14. The method of claim 11, further comprising depositing a high-k dielectric layer on the diffusion barrier layer prior to performing the doping process.

15. The method of claim 14, wherein depositing the diffusion barrier layer comprises depositing a layer of metal oxide with a Gibbs free energy of formation lower than that of a metal oxide of the high-k dielectric layer.

16. The method of claim 11, wherein performing the doping process comprises:
performing a first anneal process after depositing the first and second dopant source layers;
removing the first and second dopant source layers; and
performing a second anneal process on the first and second doped barrier portions after removing the first and second dopant source layers.

17. A method, comprising:
depositing an oxide layer on a channel region;
depositing a diffusion barrier layer on the oxide layer;
depositing a high-k dielectric layer on the diffusion barrier layer;
performing a doping process on the diffusion barrier layer and the high-k dielectric layer to form a doped diffusion barrier layer with a first dopant concentration and a doped high-k dielectric layer with a second dopant concentration lower than the first dopant concentration; and
depositing a conductive layer on the doped high-k dielectric layer.

18. The method of claim 17, wherein performing the doping process comprises doping the diffusion barrier layer and the high-k dielectric layer with metal dopants.

19. The method of claim 17, wherein performing the doping process comprises depositing, on the high-k dielectric layer, a dopant source layer with a metal oxide that is different from a metal oxide of the diffusion barrier layer.

20. The method of claim 17, wherein performing the doping process comprises:
depositing a dopant source layer on the high-k dielectric layer;
performing a first anneal process on the dopant source layer;
removing the dopant source layer; and
performing a second anneal process on the doped high-k dielectric layer after removing the dopant source layer.

* * * * *